United States Patent [19]

Haraguchi et al.

[11] Patent Number: 5,786,267
[45] Date of Patent: Jul. 28, 1998

[54] METHOD OF MAKING A SEMICONDUCTOR WAFER WITH ALIGNMENT MARKS

[75] Inventors: Hiroshi Haraguchi, Tokyo; Masahiro Abe, Yokohama; Wataru Nomura, Ichikawa, all of Japan

[73] Assignee: Kabushiki Kaisha Toshiba, Kawasaki, Japan

[21] Appl. No.: 456,695

[22] Filed: Jun. 1, 1995

Related U.S. Application Data

[62] Division of Ser. No. 263,333, Jun. 21, 1994, Pat. No. 5,532,520.

[30] Foreign Application Priority Data

Jun. 22, 1993 [JP] Japan ................................. 5-150431
Jun. 14, 1994 [JP] Japan ................................. 6-132020

[51] Int. Cl.⁶ ........................................... H01L 21/44
[52] U.S. Cl. ...................... 438/584; 438/975; 148/33.2
[58] Field of Search ........................ 437/249, 8, 194; 148/33.2

[56] References Cited

U.S. PATENT DOCUMENTS

| | | |
|---|---|---|
| 4,123,661 | 10/1978 | Wolf et al. . |
| 4,327,292 | 4/1982 | Wang et al. . |
| 4,503,334 | 3/1985 | King et al. . |
| 4,566,177 | 1/1986 | van der Ven et al. . |
| 4,623,403 | 11/1986 | Wills et al. . |
| 4,640,888 | 2/1987 | Itoh et al. . |
| 4,791,302 | 12/1988 | Nozue . |
| 5,002,902 | 3/1991 | Watanabe . |
| 5,262,361 | 11/1993 | Cho et al. .................. 437/245 |
| 5,409,862 | 4/1995 | Wada et al. ................ 437/197 |

FOREIGN PATENT DOCUMENTS

| | | |
|---|---|---|
| 0230648A3 | 3/1988 | Germany . |
| 3-197648 | 8/1991 | Japan . |
| 5-315327 | 11/1993 | Japan . |
| 6-172896 | 6/1994 | Japan . |

OTHER PUBLICATIONS

European Search Report, Jan. 13, 1997.
Noboru Nomura et al., Interferometric Nanometer Alignment for a Wafer Stepper by Two Wave–Front Reconstruction onto Deformed Wafer Gratings, Japanese Journal of Applied Physics, vol. 26, No. 6, Jun. 1987, pp. 959–964.
Harry Stover and Brian J. Thompson, Selected Papers on Optical Microlithography, SPIE Milestone Series, vol. MS 55, Jan. 1, 1992.

*Primary Examiner*—John Niebling
*Assistant Examiner*—C. Everhart
*Attorney, Agent, or Firm*—Finnegan, Henderson, Farabow, Garrett & Dunner, L.L.P.

[57] ABSTRACT

Disclosed is an alignment mark for the X directional alignment of a chip area on a semiconductor wafer, for example. The alignment mark comprises recesses and projections formed on a semiconductor substrate. The recesses or projections are repeatedly arranged in the X direction. The X directional width of the recesses or projections is set smaller than the X directional width of a grain on a metal film formed on the recesses and projections or the average particle size, as viewed from above the semiconductor substrate. The projections may be formed by an insulating layer formed on the semiconductor substrate.

33 Claims, 19 Drawing Sheets

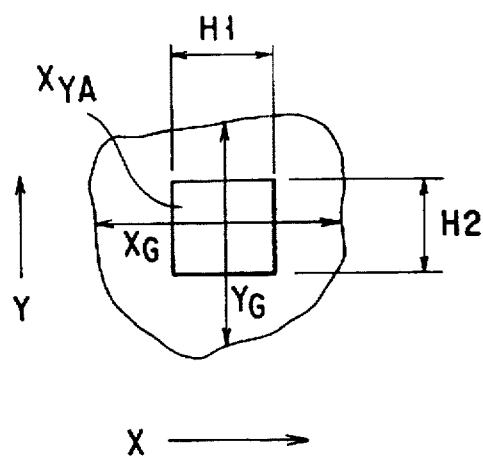
F I G. 20A
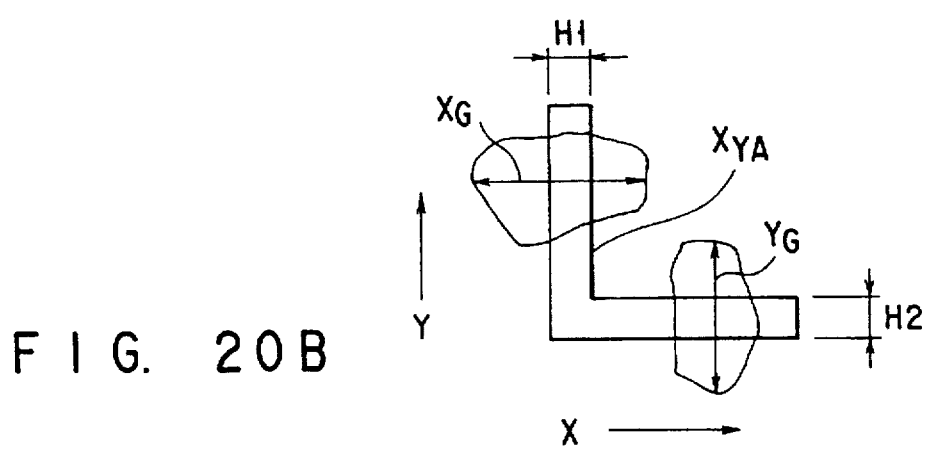
F I G. 20B
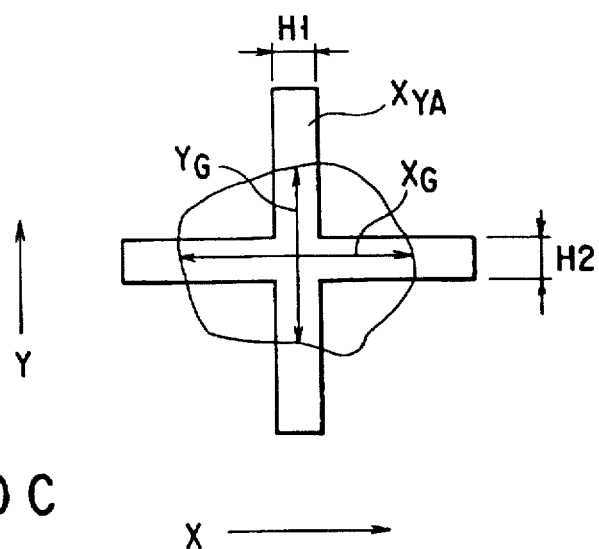
F I G. 20C

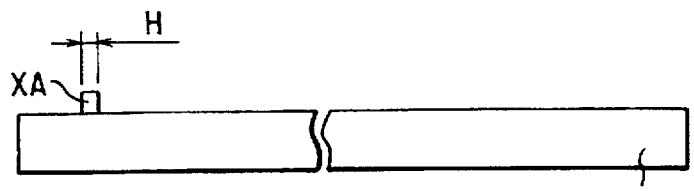
F I G. 21 A
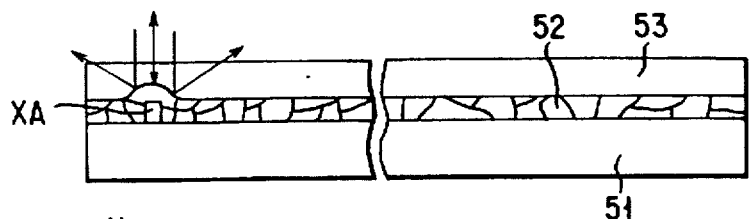
F I G. 21 B
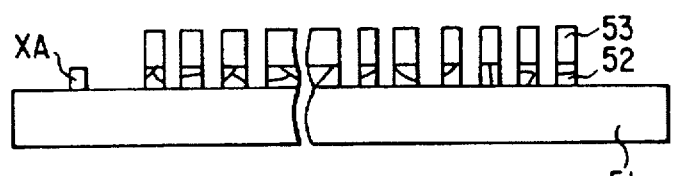
F I G. 21 C
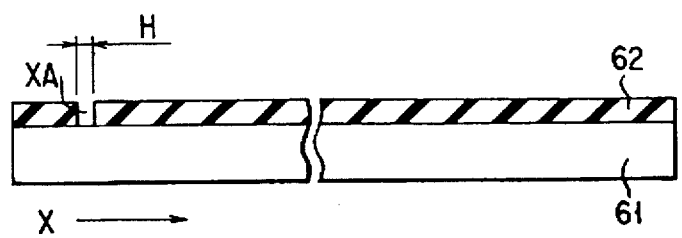
F I G. 22 A
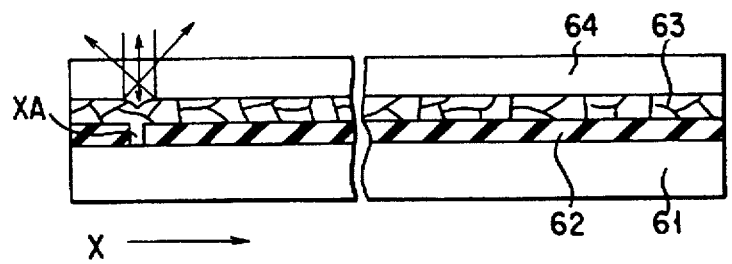
F I G. 22 B
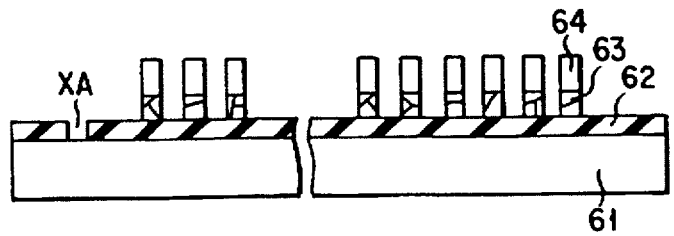
F I G. 22 C

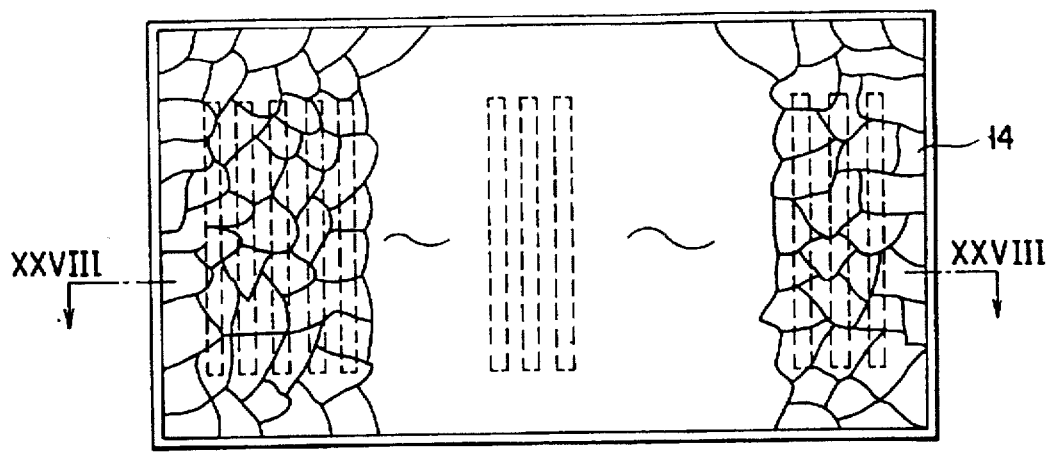
F I G. 27
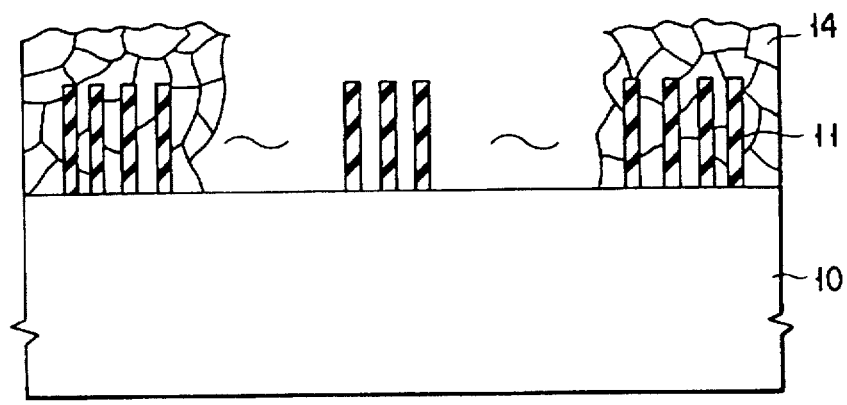
F I G. 28
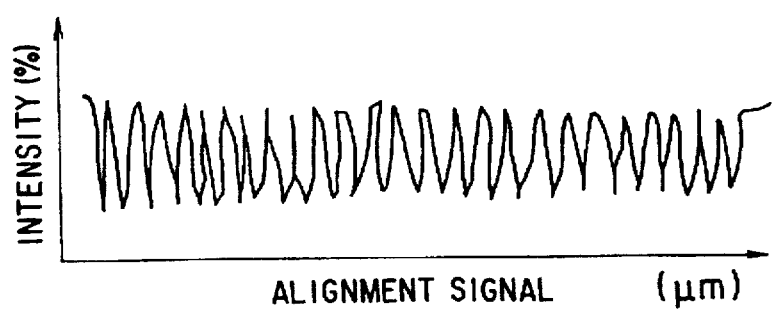
F I G. 29

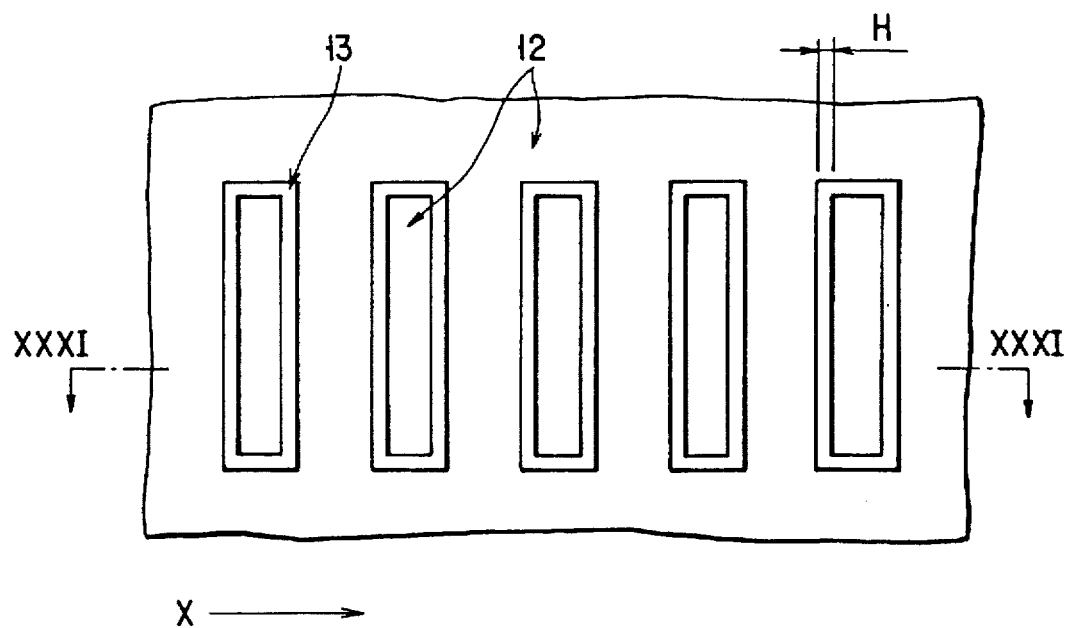
F I G. 30
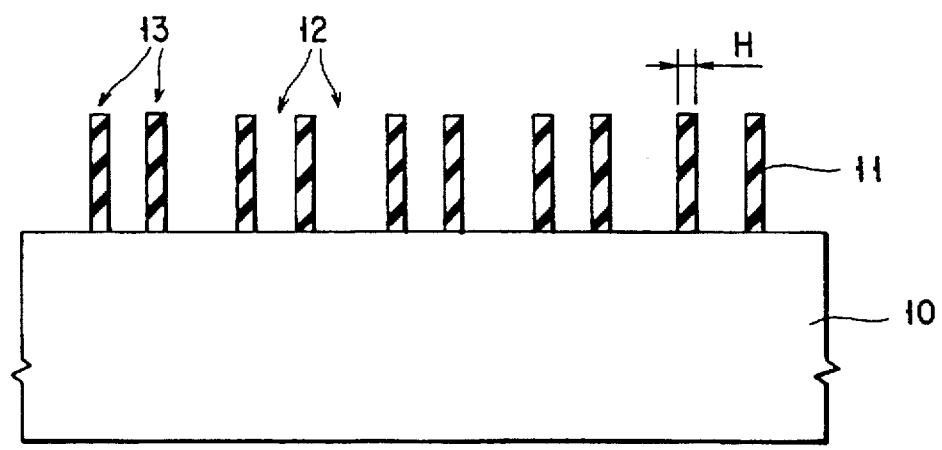
F I G. 31

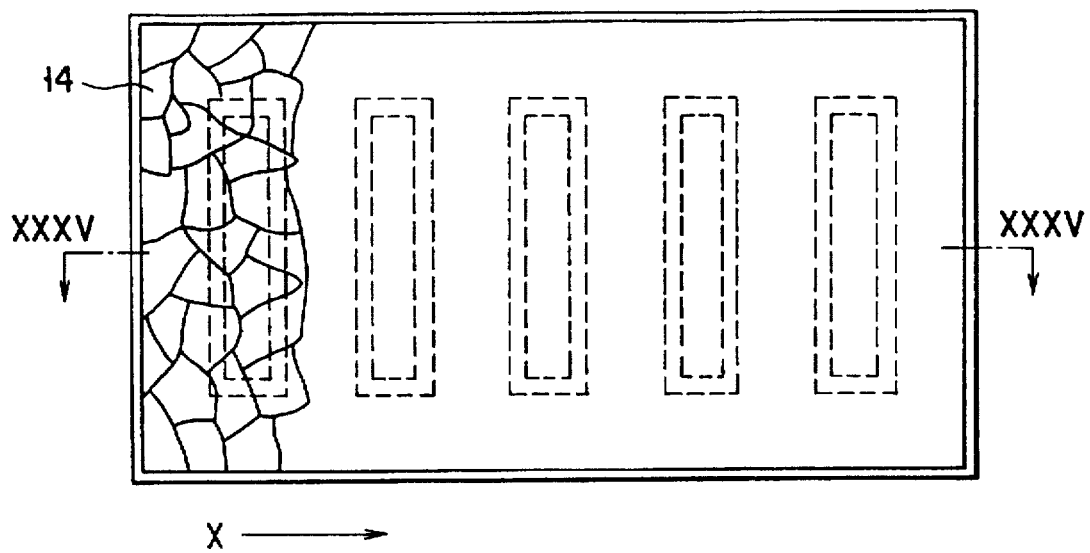
F I G. 34
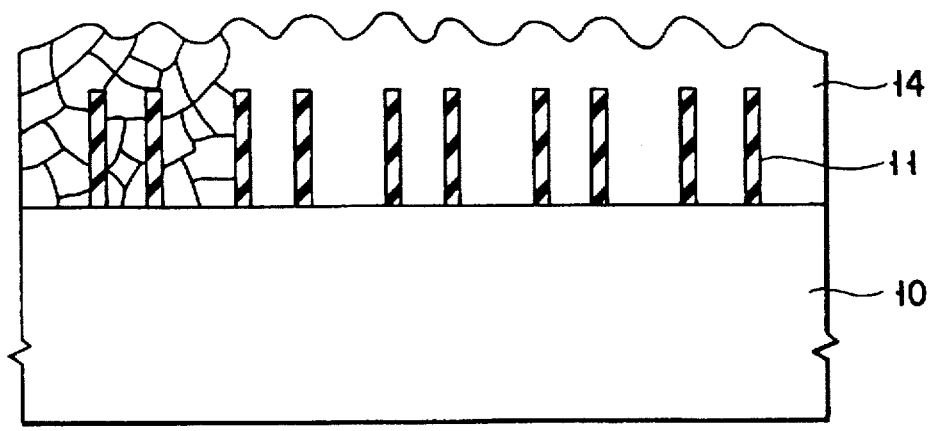
F I G. 35

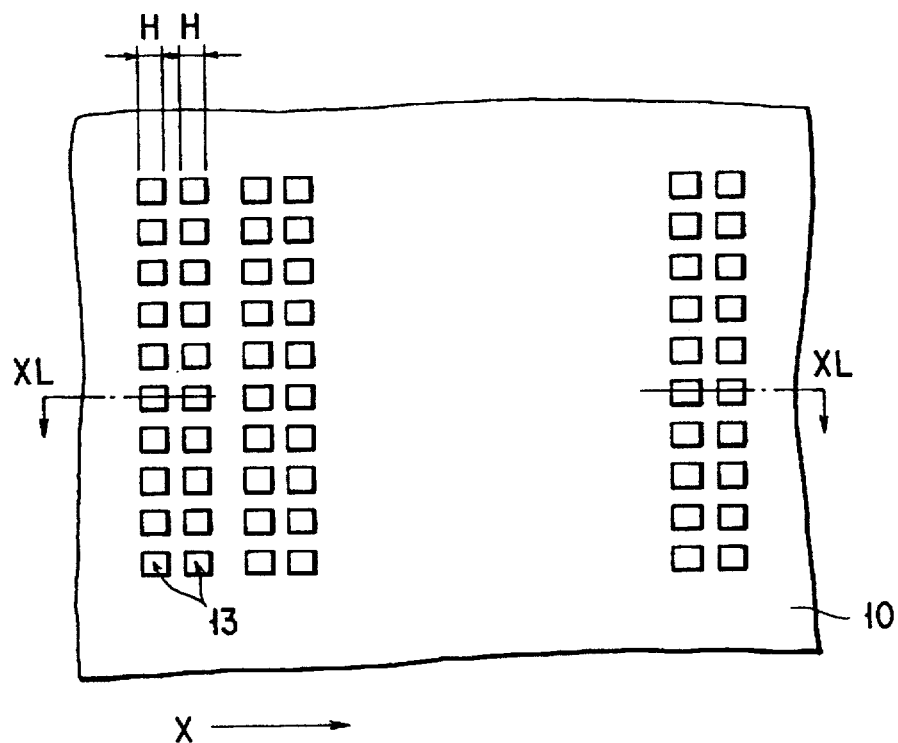
F I G. 39
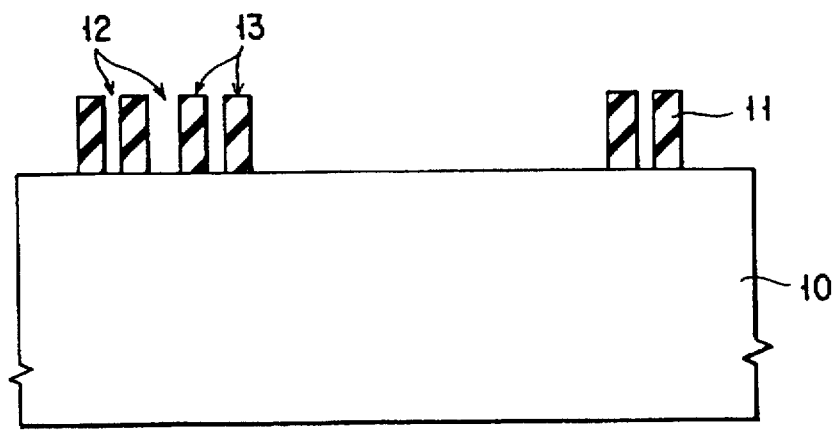
F I G. 40

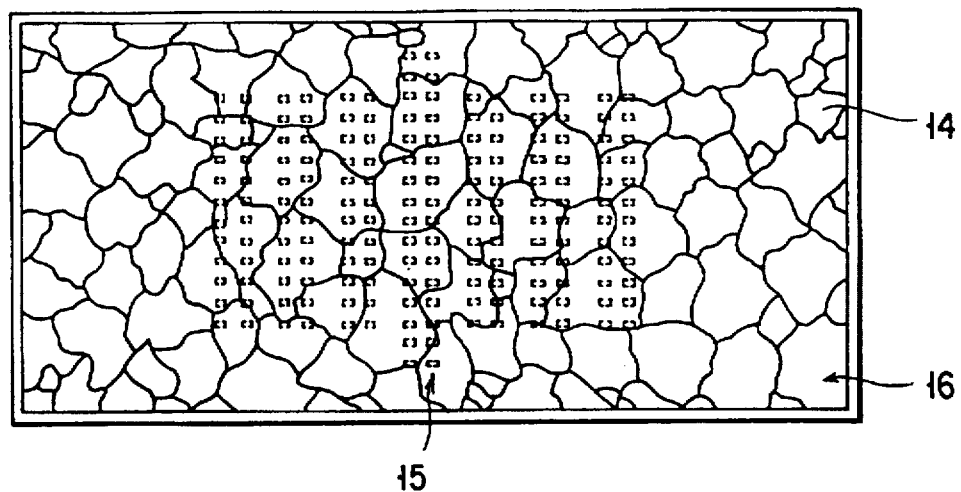
F I G. 43
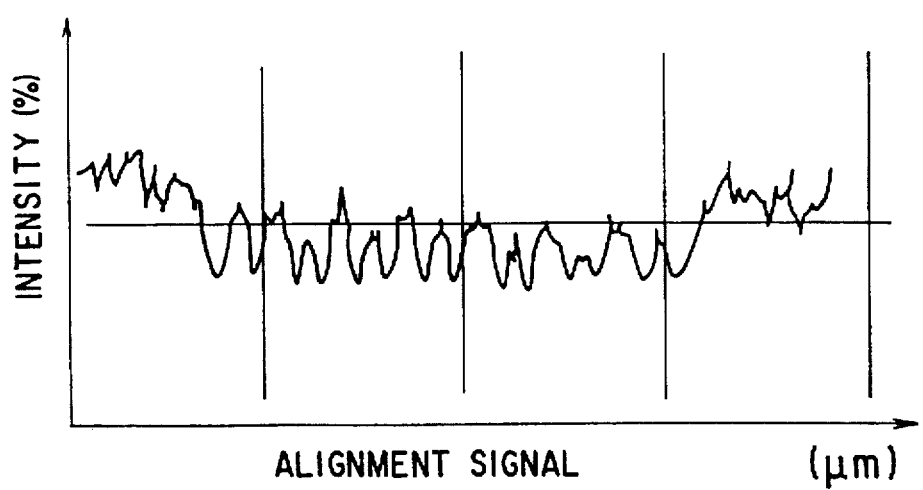
F I G. 44

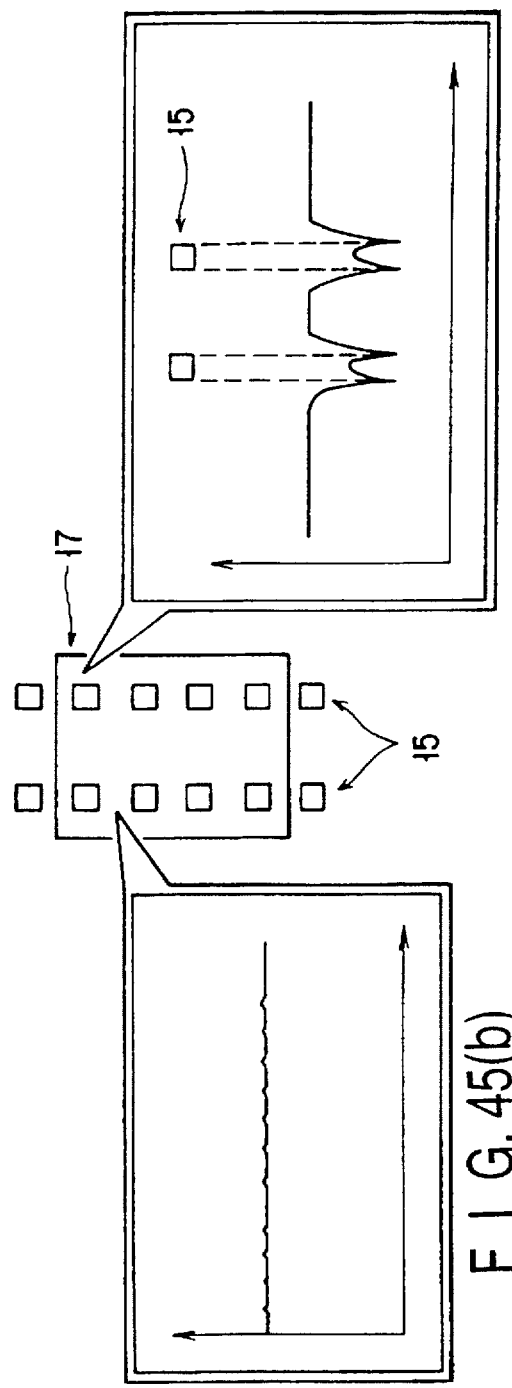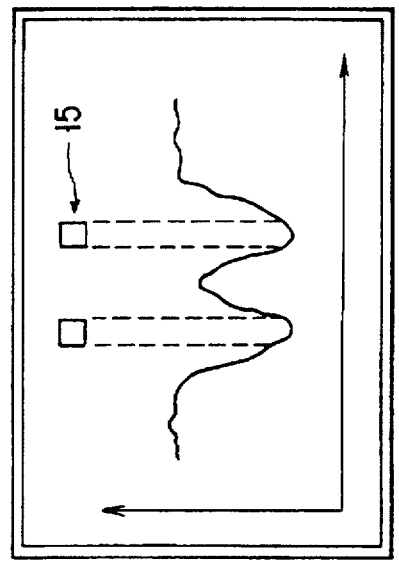

METHOD OF MAKING A SEMICONDUCTOR WAFER WITH ALIGNMENT MARKS

This application is a division of application Ser. No. 08/263,333, filed Jun. 21, 1994 now U.S. Pat. No. 5,532,520.

BACKGROUND OF THE INVENTION

1. Field of the Invention

The present invention relates to the alignment of a semiconductor device by an aligner, such as a reduction-type projection printing device.

2. Description of the Related Art

Due to the recent trend of ever improving the integration and performance of semiconductor devices, there are demands for finer patterning and higher precision in the lithography technology.

The most typical printing device today is a reduction-type projection printing device (hereinafter called "stepper"). Schemes of aligning a semiconductor device using this stepper include the alignment which uses a laser beam and the alignment which involves image processing.

FIGS. 1 and 3 show the shapes of conventional alignment marks. FIG. 2 is a cross-sectional view taken along the line II-II' in FIG. 1, and FIG. 4 is a cross-sectional view taken along the line IV-IV' in FIG. 3.

Each of the alignment marks comprises recesses 12 and projections 13 formed on an insulating layer 11 on a semiconductor substrate 10. The recesses 12 and projections 13 are alternately arranged on the semiconductor substrate 10. The alignment of the semiconductor device is performed by detecting the edges of the recesses 12 and projections 13 to recognize this alignment mark.

SUMMARY OF THE INVENTION

It is therefore an object of the present invention to permit the detection of an alignment mark by a stepper even when a metal film on the alignment mark is planarized.

To achieve this object, an alignment mark according to one aspect of the present invention comprises recesses and projections formed on a semiconductor substrate. The recesses and projections are repetitively arranged in a row direction, and the width of the recesses and projections in the row direction is smaller than the size of a grain of a metal film formed on the recesses and projections, as viewed from above the semiconductor substrate.

The recesses of the alignment mark are holes formed in an insulating layer formed on the semiconductor substrate. The width of the holes in the row direction is smaller than the size of a grain of a metal film formed on the recesses and projections.

The projections of the alignment mark are insulating layers formed on the semiconductor substrate. The width of the insulating layers in the row direction is smaller than the size of a grain of a metal film formed on the recesses and projections.

The recesses of the alignment mark may be annular holes formed in an insulating layer formed on the semiconductor substrate. The width of the annular holes in the row direction is smaller than the size of a grain of a metal film formed on the recesses and projections.

The projections of the alignment mark may be annular insulating layers formed on the semiconductor substrate. The width of the annular insulating layers in the row direction is smaller than the size of a grain of a metal film formed on the recesses and projections.

An alignment mark according to another aspect of the present invention comprises recesses and projections, formed on a semiconductor substrate. The recesses are square holes formed in an insulating layer on the semiconductor substrate. The square holes are arranged in a matrix form in the row direction, as viewed from above the semiconductor substrate. The width of the square holes in the row direction is smaller than the size of a grain of a metal film, formed on the recesses and projections.

An alignment mark according to a further aspect of the present invention comprises recesses and projections, formed on a semiconductor substrate. The projections are prismatic insulating layers formed on the semiconductor substrate. The prismatic insulating layers are arranged in a matrix form as viewed from above the semiconductor substrate. The width of the prismatic insulating layers in the row direction is smaller than the width of a grain of a metal film, formed on the recesses and projections.

With the above structures, the width of the recesses and projections of the alignment mark in the row direction is smaller than the size of a grain formed on the recesses and projections, as viewed from above the semiconductor substrate. Even if a metal film is formed on the alignment mark by the high-temperature sputtering or even if a metal film formed on the alignment mark is processed by the laser melting method, therefore, a stepper can detect the edges of the alignment mark, thus contributing to improving the alignment precision by the lithography technology.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 20A is a plan view showing an alignment mark according to a fourth embodiment of the present invention;

FIG. 20B is a plan view showing an alignment mark according to a fifth embodiment of the present invention;

FIG. 20C is a plan view showing an alignment mark according to a sixth embodiment of the present invention;

FIG. 21A is a cross-sectional view illustrating a method of patterning a metal film in the present invention;

FIG. 21B is a cross-sectional view illustrating the metal film patterning method of the present invention;

FIG. 21C is a cross-sectional view illustrating the metal film patterning method of the present invention;

FIG. 22A is a cross-sectional view illustrating another method of patterning a metal film in the present invention;

FIG. 22B is a cross-sectional view illustrating the second metal film patterning method of the present invention;

FIG. 22C is a cross-sectional view illustrating the second metal film patterning method of the present invention;

FIG. 27 is a plan view showing a metal film deposited on the alignment mark shown in FIG. 23;

FIG. 28 is a cross-sectional view taken along the line XXVIII-XXVIII' in FIG. 27;

FIG. 29 is a diagram showing an alignment signal waveform of the semiconductor device in FIG. 27;

FIG. 30 is a plan view showing an alignment mark according to a ninth embodiment of the present invention;

FIG. 31 is a cross-sectional view taken along the line XXXI-XXXI' in FIG. 30;

FIG. 34 is a plan view showing a metal film deposited on the alignment mark shown in FIG. 30;

FIG. 35 is a cross-sectional view taken along the line XXXV-XXXV' in FIG. 34;

FIG. 39 is a plan view showing an alignment mark according to an eleventh embodiment of the present invention;

FIG. 40 is a cross-sectional view taken along the line XXXX-XXXX' in FIG. 39;

FIG. 43 is a plan view showing a metal film deposited on the alignment mark shown in FIG. 39;

FIG. 44 is a diagram showing an alignment signal waveform of the semiconductor device in FIG. 43; and FIGS. 45(a)–45(c) are diagrams illustrating the principle of the alignment of the semiconductor device in FIG. 43.

DETAILED DESCRIPTION OF THE PREFERRED EMBODIMENTS

[A] Semiconductor device embodying the present invention will now be described referring to the accompanying drawings.

Figure 10:
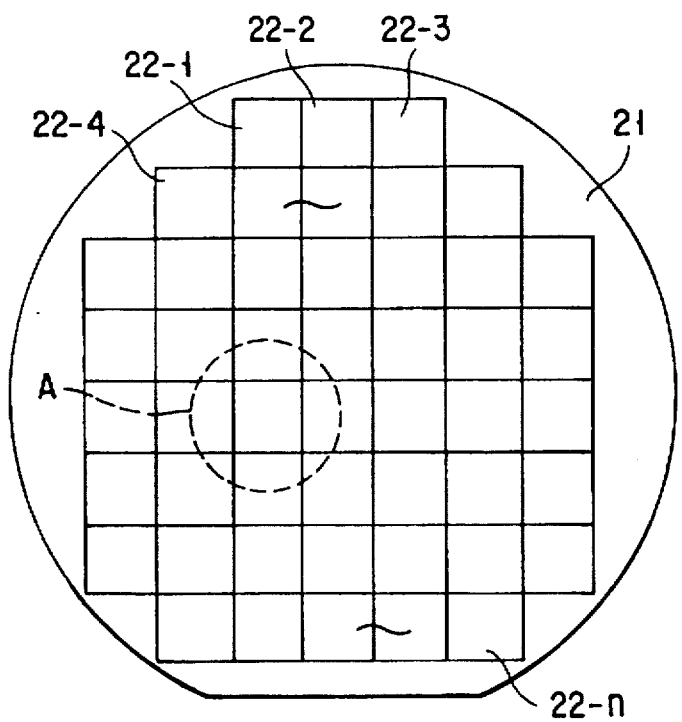
FIG. 10 is a diagram showing chip areas on a semiconductor wafer.
Figure 11:
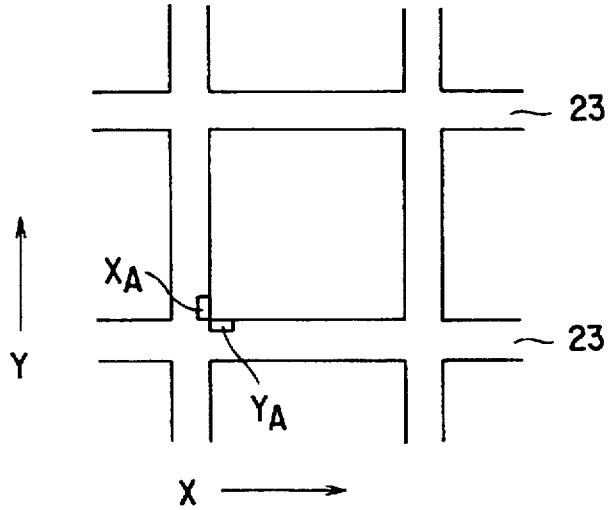
FIG. 11 is an enlarged view of a region A in FIG. 10.

FIG. 10 shows a semiconductor wafer. FIG. 11 presents an enlarged view of a region A encircled by a broken line in FIG. 10.

Arranged regularly on a semiconductor wafer 21 are a plurality of rectangular chip areas 22-1, 22-2, . . . , and 22-n on which more than one LSIs are formed. Dicing lines 23 are laid between the individual chip areas.

On the dicing lines 23 adjoining each chip area or a predetermined chip area selected from the chip areas 22-1 to 22-n are an alignment mark XA for the alignment (positioning) of that chip area with a mask in the X direction and an alignment mark YA for the alignment (positioning) of the chip area with the mask in the Y direction, for example.

The two alignment marks XA and YA are formed as a pair on the dicing lines adjoining one chip area. A single alignment mark which permits the alignment both in the X and Y directions may be formed on the dicing line. The alignment marks XA and YA are provided to expose a resist to light to obtain a predetermined pattern in a photoetching step or the like.

The alignment marks may be provided at the peripheral portion of the semiconductor wafer, for example, information area adjacent to an orientation flat. At this time, the alignment marks use a WSA (wafer scale alignment).

Figure 12:
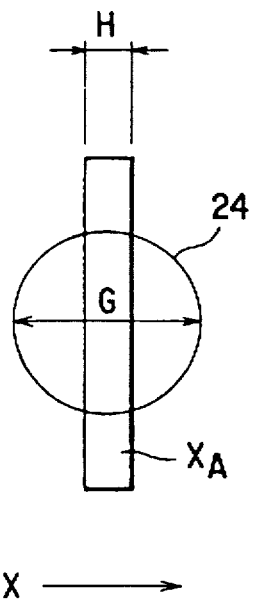
FIG. 12 is a plan view showing an alignment mark according to a first embodiment of the present invention.

FIG. 12 shows a semiconductor device according to a first embodiment of the present invention. This alignment mark XA has a rectangular shape as viewed from above the semiconductor wafer. The alignment mark XA may be a projection or a recess formed on the semiconductor wafer. A metal film (of aluminum, copper or the like) is formed on the alignment mark XA.

This alignment mark XA is provided for the alignment of a single chip area in the X direction, for example. In this case, the width, H, of the alignment mark XA from one edge to the other edge in the X direction is set smaller than the diameter, G, of a grain 24 of the metal film on the alignment mark XA. It is assumed here that the grain 24 of the metal film has an approximately circular shape as viewed from above the semiconductor wafer.

If the metal film is made of aluminum, for example, the size G of the grain 24 becomes 1 to 4 μm, so that the edge-to-edge width H of the alignment mark XA in the X direction is set to 1 μm or narrower. If the metal film is made of copper, the size G of the grain 24 becomes 4 to 5 μm, so that the edge-to-edge width H of the alignment mark XA in the X direction is set to 4 μm or narrower.

With regard to an alignment mark YA for the alignment of, for example, a single chip area in the Y direction, though not shown, the edge-to-edge width H of this alignment mark YA in the Y direction is also set smaller than the diameter G of the grain of the metal film on the alignment mark YA.

With the above structure, in performing the X directional alignment of a single chip area, the edge-to-edge width H of the alignment mark XA in the X direction is set smaller than the diameter G of the grain of the metal film on the alignment mark XA. Likewise, in performing the Y directional alignment of a single chip area, the edge-to-edge width H of the alignment mark YA in the Y direction is set smaller than the diameter G of the grain of the metal film on the alignment mark YA.

It is therefore possible to prevent the grain of the metal film from making the detection of the recesses and projections of the metal film on the alignment mark difficult, thus ensuring accurate alignment.

Figure 13:
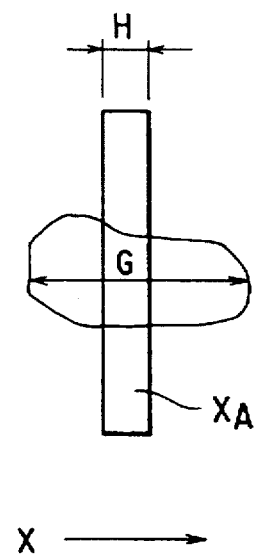
FIG. 13 is a plan view showing an alignment mark according to a second embodiment of the present invention.

FIG. 13 shows a semiconductor device according to a second embodiment of the present invention. This embodiment is applied to the case where the shape of the grain of the metal film formed on the alignment mark XA is not determined specifically.

In other words, the grain of the metal film can actually take a variety of shapes and cannot be specified. In executing the X directional alignment of, for example, a single chip area, therefore, the edge-to-edge width H of the alignment mark XA in the X direction is set smaller than the diameter G of the grain of the metal film on the alignment mark XA.

In performing the Y directional alignment of a single chip area, for example, the edge-to-edge width H of the alignment mark YA in the Y direction is set smaller than the diameter G of the grain of the metal film on the alignment mark YA.

It is therefore possible to prevent the grain of the metal film from making the detection of the recesses and projections of the metal film on the alignment mark difficult, thus ensuring accurate alignment.

Figure 14:
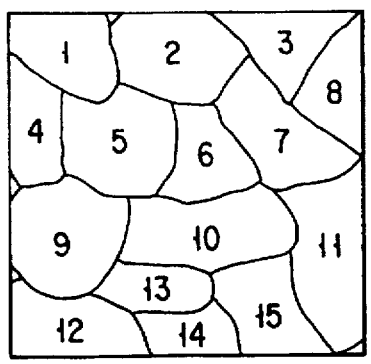
FIG. 14 is a diagram for explaining the concept of the average size in a third embodiment of the present invention.
Figure 15:
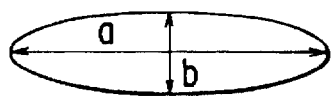
FIG. 15 is a diagram for explaining the concept of the average size in the third embodiment of the present invention.

FIGS. 14 and 15 show a semiconductor device according to a third embodiment of the present invention. This embodiment utilizes the concept of the average size with respect to the size of the grain of the metal film.

In executing the X directional alignment of a single chip area, for example, the edge-to-edge width of the alignment mark XA in the X direction is set smaller than the average size, L, of the metal film. Likewise, in performing the Y directional alignment of a single chip area, for example, the edge-to-edge width of the alignment mark YA in the Y direction is set smaller than the average size L of the metal film.

The average size L is defined as follows.

a) When the number of grains of the metal film per unit area S at any location on the semiconductor wafer is n as shown in FIG. 14, $$\text{average size } L = 2 \times (S/n\pi)^{1/2}.$$

b) When the grain of the metal film as viewed from above the semiconductor wafer has a nearly elliptical shape as shown in FIG. 15, $$\text{average size } L = (a \times b)^{1/2}$$

where a is the longer radius and b is the shorter radius.

With the above structure, in performing the X directional alignment of, for example, a single chip area, the edge-to-edge width H of the alignment mark XA in the X direction is set smaller than the average size of the metal film. Likewise, in performing the Y directional alignment of, for example, a single chip area, the edge-to-edge width H of the alignment mark YA in the Y direction is set smaller than the average size of the metal film.

It is therefore possible to prevent the grain of the metal film from making the detection of the recesses and projections of the metal film on the alignment mark difficult, thus ensuring accurate alignment.

FIG. 20A shows a semiconductor device according to a fourth embodiment of the present invention. This alignment mark XYA has a square shape as viewed from above the semiconductor wafer. The alignment mark XYA may be a projection or a recess formed on the semiconductor wafer. A metal film (of aluminum, copper or the like) is formed on the alignment mark XYA.

This alignment mark XYA is provided for the alignment of, for example, a single chip area in the X direction and Y direction. In this case, the edge-to-edge width, H1, of the alignment mark XYA in the X direction is set smaller than the width, XG, of a grain of the metal film on the alignment mark XYA (or the diameter if the grain is circular) or the average size L. The edge-to-edge width, H2, of the alignment mark XYA in the Y direction is set smaller than the width, YG, of a grain of the metal film on the alignment mark XYA (or the diameter if the grain is circular) or the average size L.

With the above structure, it possible to prevent the grain of the metal film from making the detection of the recesses and projections of the metal film on the alignment mark difficult, thus ensuring accurate alignment.

FIG. 20B shows a semiconductor device according to a fifth embodiment of the present invention. This alignment mark XYA has an L shape (hook shape) as viewed from above the semiconductor wafer. The alignment mark XYA may be a projection or a recess formed on the semiconductor wafer. A metal film (of aluminum, copper or the like) is formed on the alignment mark XYA.

This alignment mark XYA is provided for the alignment of, for example, a single chip area in the X direction and Y direction. In this case, the edge-to-edge width, Hi, of the alignment mark XYA in the X direction is set smaller than the width, XG, of a grain of the metal film on the alignment mark XYA (or the diameter if the grain is circular) or the average size L. The edge-to-edge width, H2, of the alignment mark XYA in the Y direction is set smaller than the width, YG, of a grain of the metal film on the alignment mark XYA (or the diameter if the grain is circular) or the average size L.

With the above structure, it possible to prevent the grain of the metal film from making the detection of the recesses and projections of the metal film on the alignment mark difficult, thus ensuring accurate alignment.

FIG. 20C shows a semiconductor device according to a sixth embodiment of the present invention. This alignment mark XYA has a cross shape as viewed from above the semiconductor wafer. The alignment mark XYA may be a projection or a recess formed on the semiconductor wafer. A metal film (of aluminum, copper or the like) is formed on the alignment mark XYA.

This alignment mark XYA is provided for the alignment of, for example, a single chip area in the X direction and Y direction. In this case, the edge-to-edge width, H1, of the alignment mark XYA in the X direction is set smaller than the width, XG, of a grain of the metal film on the alignment mark XYA (or the diameter if the grain is circular) or the average size L. The edge-to-edge width, H2, of the alignment mark XYA in the Y direction is set smaller than the width, YG, of a grain of the metal film on the alignment mark XYA (or the diameter if the grain is circular) or the average size L.

With the above structure, it possible to prevent the grain of the metal film from making the detection of the recesses and projections of the metal film on the alignment mark difficult, thus ensuring accurate alignment.

[B] Aligning method embodying the present invention will now be described referring to the accompanying drawings.

Figure 16:
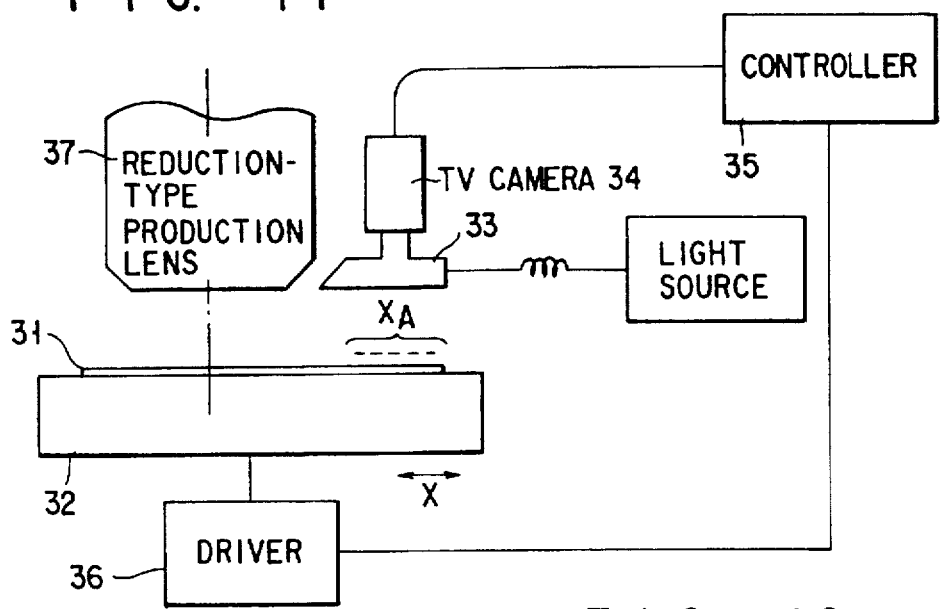
FIG. 16 is a diagram showing a stepper that executes alignment through image processing.

FIG. 16 shows a stepper that executes alignment through image processing.

A semiconductor wafer 31 is placed on a stage 32. An illuminating device 33 irradiates light on an alignment mark XA on the semiconductor wafer 31. A television camera 34 detects reflected light from the semiconductor wafer 31. A controller 35 recognizes the alignment mark by the intensity of the reflected light from the semiconductor wafer 31. A driver 36 executes alignment based on an instruction from the controller 35. After the alignment is completed, exposure is performed with a reduction-type projection lens 37.

Figure 17A:
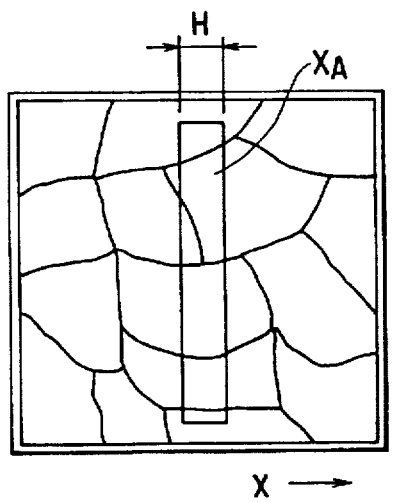
FIG. 17A is a diagram showing an image recognizing area of the stepper in FIG. 16.
Figure 17B:
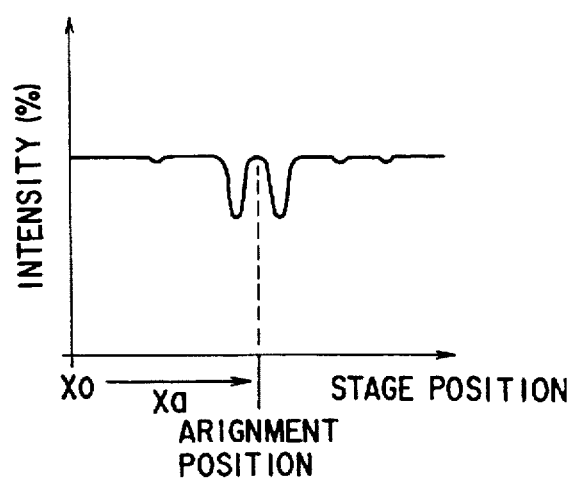
FIG. 17B is a diagram showing a signal waveform obtained in the image recognizing area in FIG. 17A.

FIG. 17A shows an image recognizing area at the time the alignment mark is recognized by the stepper in FIG. 16. FIG. 17B shows a signal waveform obtained in the image recognizing area in FIG. 17A.

The edge-to-edge width H of the alignment mark XA in the X direction is smaller than the X directional width of the grain of the metal film on the alignment mark XA (the diameter if the grain is circular) or the average size. It is therefore possible to prevent the grain of the metal film from making the detection of the recesses and projections of the metal film on the alignment mark difficult, and substantially the same recesses and projections as those of the alignment mark XA appear on the metal film.

If the alignment mark XA is located in the image recognizing area as shown in FIG. 17A, the stepper can accurately detect the edges of the alignment mark as indicated by the waveform chart in FIG. 17B.

The alignment of a chip area on the semiconductor wafer with the mask can therefore be executed accurately by moving the stage.

According to the above alignment method, as the width of the alignment mark is set smaller than the size of the grains of the metal film, the size of the image recognizing area can be reduced to ⅓ of the conventionally required size. Thus, the number of grains of the metal film included in the image recognizing area becomes smaller than that of the prior art. Accordingly, it is difficult for noise to appear on the waveform shown in FIG. 17B, so that the edges of the alignment mark can be detected accurately without using approximation. As the image recognizing area becomes smaller, the throughput of the semiconductor device can be improved.

Figure 18:
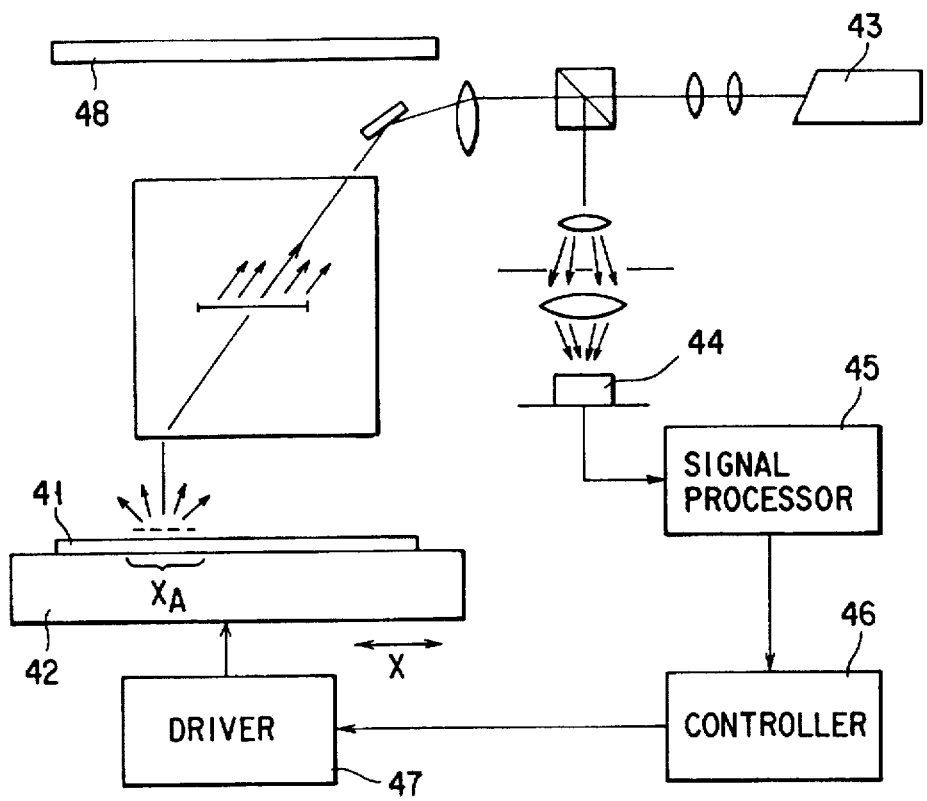
FIG. 18 is a diagram showing a stepper that executes alignment using a laser.

FIG. 18 shows a stepper that executes alignment using a laser.

A semiconductor wafer 41 is placed on a stage 42. A laser tube 43 irradiates an He-Ne laser beam. This He-Ne laser beam is shaped into a slit-like beam and is then irradiated on the alignment mark XA on the semiconductor wafer 41. The He-Ne laser beam is diffracted and scattered by the step of the alignment mark.

A detector 44 detects the diffracted light or scattered light. A signal processor 45 processes the output signal of the detector 44. A controller 46 recognizes the alignment mark based on a signal waveform obtained from the signal processor 45. A driver 47 executes alignment based on an instruction from the controller 46. After the alignment is completed, exposure (printing) is carried out using a reticule 48.

Figure 19A:
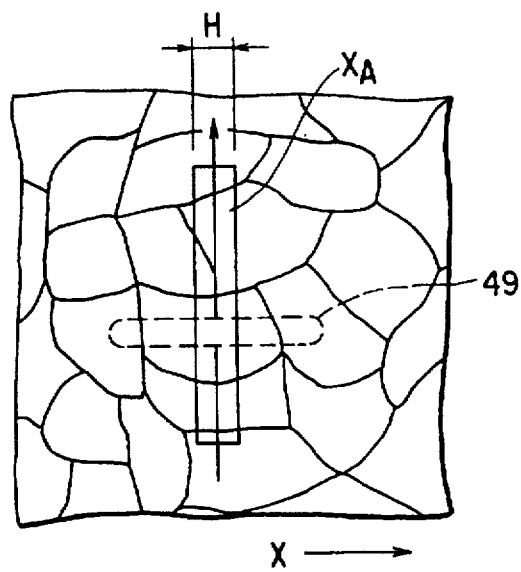
FIG. 19A is a diagram showing a laser scanning path of the stepper in FIG. 18.
Figure 19B:
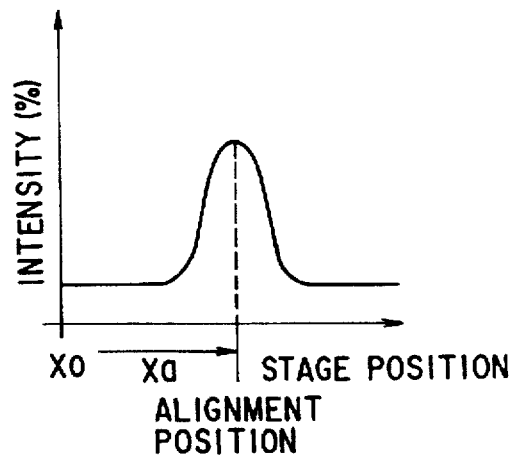
FIG. 19B is a diagram showing a signal waveform obtained by the laser scanning in FIG. 19A.

FIG. 19A shows a laser scanning path at the time the stepper in FIG. 18 recognizes the alignment mark. FIG. 19B shows a signal waveform obtained by the laser scanning in FIG. 19A.

The edge-to-edge width H of the alignment mark XA in the X direction is smaller than the X directional width of the grain of the metal film on the alignment mark XA (the diameter if the grain is circular) or the average size. It is therefore possible to prevent the grain of the metal film from making the detection of the recesses and projections of the metal film on the alignment mark difficult, and substantially the same recesses and projections as those of the alignment mark XA appear on the metal film.

If the alignment mark XA is scanned with the laser beam 49 in the Y direction as shown in FIG. 19A, the position of the alignment mark can accurately be detected as indicated by the waveform chart in FIG. 19B.

The alignment of a chip area on the semiconductor wafer with the mask can therefore be executed accurately by moving the stage.

According to the above alignment method, since the width of the alignment mark is set smaller than the size of the grains of the metal film, the spot size of the He-Ne laser image can be reduced to about a half. The scanning area of the laser beam can thus be reduced, so that the throughput of the semiconductor device can be improved. Further, if the spot size of the He-Ne laser image becomes about a half, the number of grains on the metal film included in the laser scanning area is reduced considerably. It therefore becomes difficult for noise to appear on the waveform shown in FIG. 19B, so that the threshold value of the slice circuit for removing the noise can be reduced to a half.

[C] Method of manufacturing a semiconductor device embodying the present invention will now be described referring to the accompanying drawings.

FIGS. 21A through 21C illustrate how to perform alignment with the alignment mark of the present invention having a projection and pattern a metal film.

First, although not shown, a metal film is formed on the semiconductor substrate under given conditions. Thereafter, for example, the number of grains, n, on the metal film which are included in any given unit area S on the semiconductor substrate is obtained. The value that is obtained from the equation $2 \times (S/n\pi)^{1/2}$ is taken as the average size L. The average size L may be obtained by other methods.

Next, an alignment mark XA which is constituted of at least one projection is formed on a semiconductor wafer (semiconductor substrate) 51 as shown in FIG. 21A. This alignment mark XA is provided for the alignment of a chip area on the semiconductor wafer 51 in the X direction. At the same time, an alignment mark for the alignment of a chip area in the Y direction is formed.

The alignment mark XA is formed in such a way that, as viewed from above the semiconductor wafer 51, the X directional width of at least one projection becomes smaller than the average size obtained from the above equation, for example. Likewise, an alignment mark for the alignment in the Y direction is formed in such a way that, as viewed from above the semiconductor wafer 51, the Y directional width of at least one projection becomes smaller than the average size obtained from the above equation, for example.

If the metal film is made of aluminum, for example, the average size L generally becomes 1 to 4 µm, so that the X directional width of the alignment mark is set to 1 µm or narrower. If the metal film is made of copper, the average size L generally becomes 4 to 5 µm, so that the X directional width of the alignment mark XA is set to 4 µm or narrower.

Next, a metal film 52 is formed on the semiconductor substrate 51 under the aforementioned given conditions as shown in FIG. 21B. At this time, projections are also formed on the metal film 52 on the alignment mark XA. A resist film 53 is formed on the metal film 52.

Then, the semiconductor wafer 51 is moved on the stage of the stepper which executes alignment through image processing, for example. Light is irradiated on the metal film 52 on the alignment mark XA to detect the recesses and projections of this metal film 52.

Then, the X directional alignment of a chip area on the semiconductor wafer 51 with the mask is performed. Likewise, the Y directional alignment of the chip area on the semiconductor wafer 51 with the mask is performed. After the X and Y directional alignments are completed, exposure is performed on the resist film 53 to transfer the pattern on the mask onto the resist film 53.

Next, as shown in FIG. 21C, the resist film 53 is developed to form a predetermined pattern on the resist film 53. Then, the metal film 52 is patterned with the resist film 53 as a mask.

According to the above metal-film patterning method, the alignment mark can easily be detected and the alignment of a chip area on the semiconductor wafer with the mask can accurately be carried out. It is therefore possible to reduce the alignment error between the chip area on the semiconductor wafer and the mask, thus ensuring the patterning of the metal film at high precision.

FIGS. 22A through 22C illustrate how to perform alignment with the alignment mark of the present invention having a projection and pattern a metal film.

First, although not shown, a metal film is formed on the semiconductor substrate under given conditions. Thereafter, for example, the number of grains, n, on the metal film which are included in any given unit area S on the semiconductor substrate is obtained. The value that is obtained from the equation $2 \times (S/n\pi)^{1/2}$ is taken as the average size L. The average size L may be obtained by other methods.

Next, as shown in FIG. 22A, an alignment mark XA which is constituted of at least one recess is formed on a semiconductor wafer (semiconductor substrate) 61. This alignment mark XA is provided for the alignment of a chip area on the semiconductor wafer 61 in the X direction. At the same time, an alignment mark for the alignment of a chip area in the Y direction is formed.

The alignment mark XA is formed in such a way that, as viewed from above the semiconductor wafer 61, the X directional width of at least one recess becomes smaller than the average size obtained from the above equation, for example. Likewise, an alignment mark for the alignment in the Y direction is formed in such a way that, as viewed from above the semiconductor wafer 61, the Y directional width of at least one recess becomes smaller than the average size obtained from the above equation, for example.

If the metal film is made of aluminum, for example, the average size L generally becomes 1 to 4 µm, so that the X directional width of the alignment mark is set to 1 µm or narrower. If the metal film is made of copper, the average size L generally becomes 4 to 5 µm, so that the X directional width of the alignment mark XA is set to 4 µm or narrower.

Next, a metal film 62 is formed on the semiconductor substrate 61 under the aforementioned given conditions as shown in FIG. 22B. At this time, recesses are also formed on the metal film 62 on the alignment mark XA. A resist film 63 is formed on the metal film 62.

Then, the semiconductor wafer 61 is moved on the stage of the stepper which executes alignment through image processing, for example. Light is irradiated on the metal film 62 on the alignment mark XA to detect the recesses and projections of this metal film 62.

Then, the X directional alignment of a chip area on the semiconductor wafer 61 with the mask is performed. Likewise, the Y directional alignment of the chip area on the semiconductor wafer 61 with the mask is performed. After the X and Y directional alignments are completed, exposure is performed on the resist film 63 to transfer the pattern on the mask onto the resist film 63.

Next, as shown in FIG. 22C, the resist film 63 is developed to form a predetermined pattern on the resist film 63. Then, the metal film 62 is patterned with the resist film 63 as a mask.

According to the above metal-film patterning method, the alignment mark can easily be detected and the alignment of a chip area on the semiconductor wafer with the mask can accurately be carried out. It is therefore possible to reduce the alignment error between the chip area on the semiconductor wafer and the mask, thus ensuring the patterning of the metal film at high precision.

[D] Semiconductor device embodying the present invention will now be described referring to the accompanying drawings.

Figure 23:
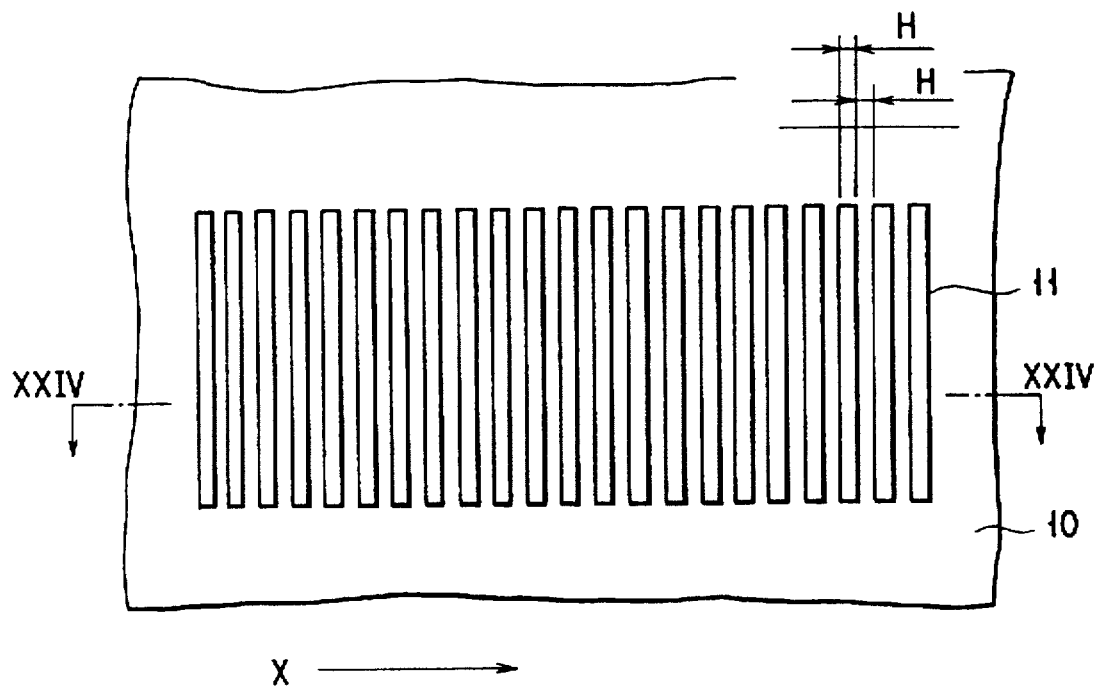
FIG. 23 is a plan view showing an alignment mark according to a seventh embodiment of the present invention.
Figure 24:
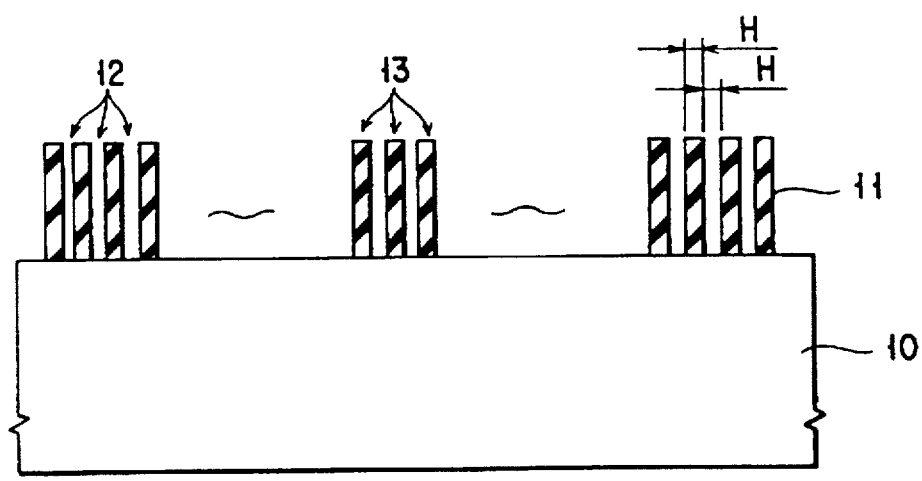
FIG. 24 is a cross-sectional view taken along the line XXIV-XXIV' in FIG. 23.

FIG. 23 shows a semiconductor device according to a seventh embodiment of the present invention. FIG. 24 is a cross-sectional view taken along the line XXIV-XXIV' in FIG. 23.

This alignment mark comprises recesses 12 and projections 13 formed on an insulating layer 11 on a semiconductor substrate 10. The recesses 12 and projections 13 are alternately arranged in a row on the semiconductor substrate 10.

The projections 13 are constituted of the insulating layer 11 formed on the semiconductor substrate 10. The alignment of this semiconductor device is executed by detecting the edges of the boundaries between the recesses 12 and projections 13 and recognizing the alignment mark.

The alignment mark according to this embodiment differs from the conventional alignment marks in the following points.

If this alignment mark is for the X directional alignment, the row of the recesses and projections are formed to extend in the X direction. The width H of the recesses 12 and projections 13 of the alignment mark in the row direction (X direction) is smaller than the X directional width of the grain on the metal film on the alignment mark (the diameter if the grain is circular) or the average size.

If the metal film is made of aluminum, for example, the size G of the grain becomes 1 to 4 µm, so that the edge-to-edge width H of the alignment mark XA in the X direction is set to 1 µm or narrower. If the metal film is made of copper, the size G of the grain becomes 4 to 5 µm, so that the edge-to-edge width H of the alignment mark XA in the X direction is set to 4 µm or narrower.

According to the conventional alignment marks, the width H of the recesses 12 and projections 13 of those alignment marks in the row direction (X direction) is about 6 µm regardless of the size of the grain of the metal film 14.

The size of the grain on the metal film 14 varies with the conditions for the high-temperature sputtering method for forming this metal film or the conditions for processing this metal film by the laser melting method.

Therefore, the concept of the present invention is such that in performing the X directional alignment of a single chip area, the X directional width of the recesses or projections of the alignment mark is set smaller than the X directional width of the grain of the metal film on the alignment mark (diameter if the grain is, circular) or the average size L, and in performing the Y directional alignment of a single chip area, the Y directional width of the recesses or projections of the alignment mark is set smaller than the Y directional width of the grain of the metal film on the alignment mark (diameter if the grain is circular) or the average size L.

Figure 25:
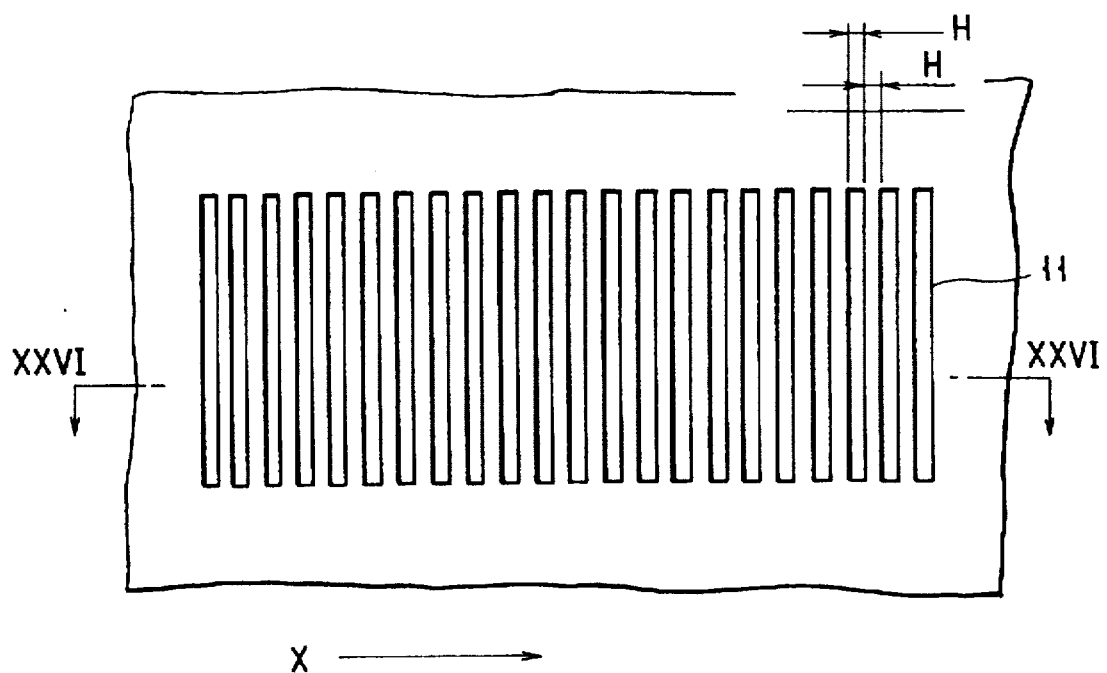
FIG. 25 is a plan view showing an alignment mark according to an eighth embodiment of the present invention.
Figure 26:
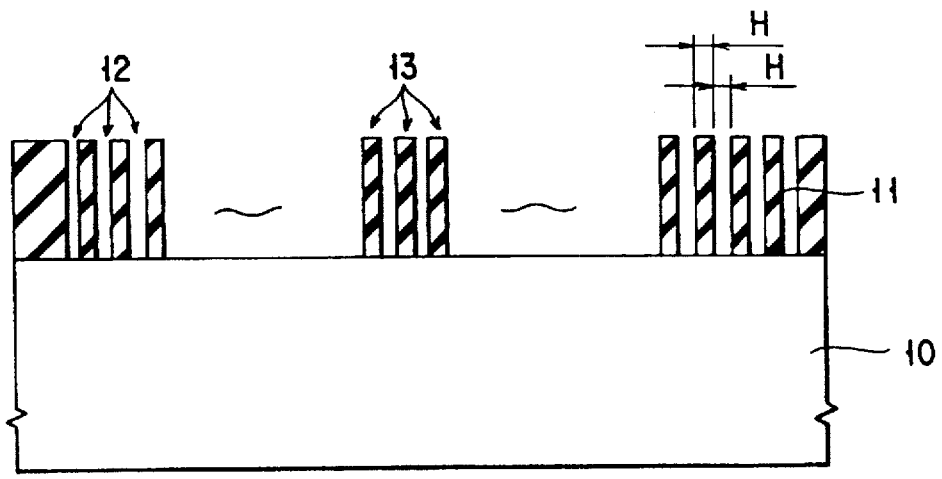
FIG. 26 is a cross-sectional view taken along the line XXVI-XXVI' in FIG. 25.

FIG. 25 shows a semiconductor device according to an eighth embodiment of the present invention. FIG. 26 is a cross-sectional view taken along the line XXVI-XXVI' in FIG. 25.

This alignment mark comprises recesses 12 and projections 13 formed on an insulating layer 11 on a semiconductor substrate 10. The recesses 12 and projections 13 are alternately arranged in a row on the semiconductor substrate 10.

The recesses 12 are constituted of holes formed in the insulating layer 11 formed on the semiconductor substrate 10. The alignment of this semiconductor device is executed by detecting the edges of the boundaries between the recesses 12 and projections 13 and recognizing the alignment mark.

The alignment mark according to this embodiment differs from the conventional alignment marks in the following points.

If this alignment mark is for the X directional alignment, the row of the recesses and projections are formed to extend in the X direction. The width H of the recesses 12 and projections 13 of the alignment mark in the row direction (X direction) is smaller than the X directional width of the grain of the metal film on the alignment mark (the diameter if the grain is circular) or the average size.

If the metal film is made of aluminum, for example, the size G of the grain becomes 1 to 4 μm, so that the edge-to-edge width H of the alignment mark XA in the X direction is set to 1 μm or narrower. If the metal film is made of copper, the size G of the grain becomes 4 to 5 μm, so that the edge-to-edge width H of the alignment mark XA in the X direction is set to 4 μm or narrower.

According to the conventional alignment marks, the width H of the recesses 12 and projections 13 of those alignment marks in the row direction (X direction) is about 6 μm regardless of the size of the grain on the metal film 14.

The size of the grain of the metal film 14 varies with the conditions for the high-temperature sputtering method for forming this metal film or the conditions for processing this metal film by the laser melting method.

Therefore, the concept of the present invention is such that in performing the X directional alignment of a single chip area, the X directional width of the recesses or projections of the alignment mark is set smaller than the X directional width of the grain of the metal film on the alignment mark (diameter if the grain is circular) or the average size L, and in performing the Y directional alignment of a single chip area, the Y directional width of the recesses or projections of the alignment mark is set smaller than the Y directional width of the grain of the metal film on the alignment mark (diameter if the grain is circular) or the average size L.

FIG. 27 shows a semiconductor device having a metal film (planarized) deposited on the alignment mark according to the seventh embodiment. FIG. 28 is a cross-sectional view taken along the line XXVIII-XXVIII' in FIG. 27.

A metal film 14 is generally formed in one of the following two methods.

a) A metal film is deposited on the semiconductor substrate 10 while heating the semiconductor substrate 10° to 460° C. or above by the high-temperature sputtering method.

b) After the metal film 14 is deposited on the semiconductor substrate 10 by sputtering, the metal film 14 is planarized by the laser melting method.

In the use of either method, a grain is formed on the metal film 14 deposited on the semiconductor substrate 10.

According to the seventh and eighth embodiments, however, with regard to the alignment mark for the X directional alignment of, for example, a single chip area, the X directional width of the recesses or projections of the alignment mark is set smaller than the X directional width of the grain of the metal film on the alignment mark (diameter if the grain is circular) or the average size.

It is therefore possible to prevent the grain from making the detection of the edges (indicated by the broken lines in FIG. 25) of the recesses and projections of the metal film 14 on the alignment mark difficult.

FIG. 29 shows an alignment signal waveform obtained by the stepper when the alignment of the semiconductor device in FIGS. 27 and 28 is executed through image processing.

The alignment signal waveform has not been influenced by the grain of the metal film, and the high and low intensities of the signal waveform are regularly repeated. In other words, the stepper accurately detects the edges of the recesses and projections of the alignment mark. It is therefore possible to align the semiconductor device accurately, thus eliminating the misalignment-oriented problem at the time the metal film is processed.

The alignment marks of the seventh and eighth embodiments can be used for the alignment which involves image processing and the alignment which uses a laser beam.

FIG. 30 shows a semiconductor device according to a ninth embodiment of the present invention. FIG. 31 is a cross-sectional view taken along the line XXXI-XXXI' in FIG. 30.

Figure 1:
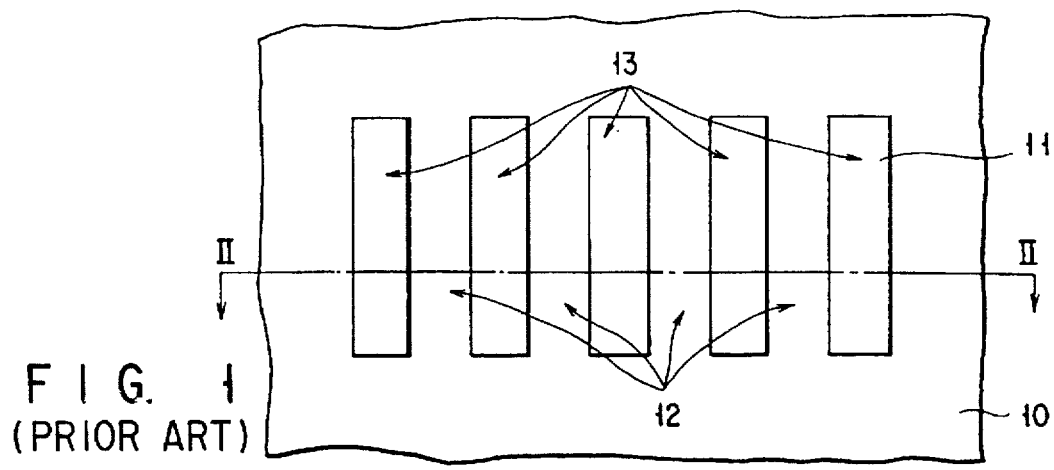
FIG. 1 is a plan view showing a conventional alignment mark.
Figure 2:
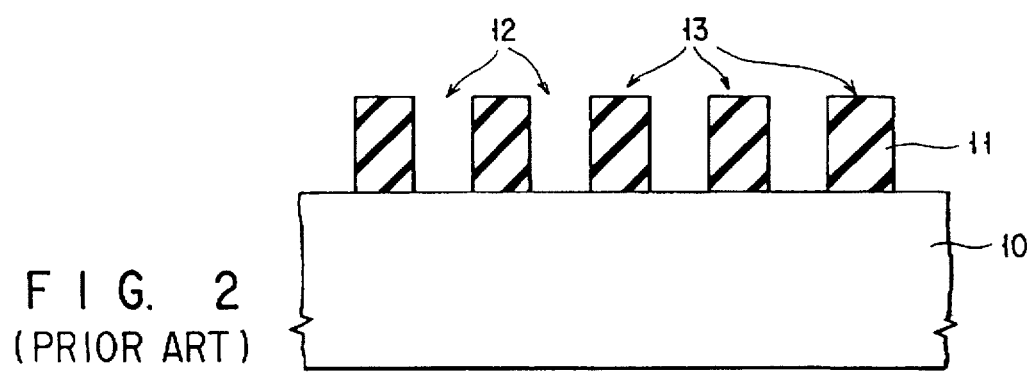
FIG. 2 is a cross-sectional view taken along the line II-II' in FIG. 1.
Figure 3:
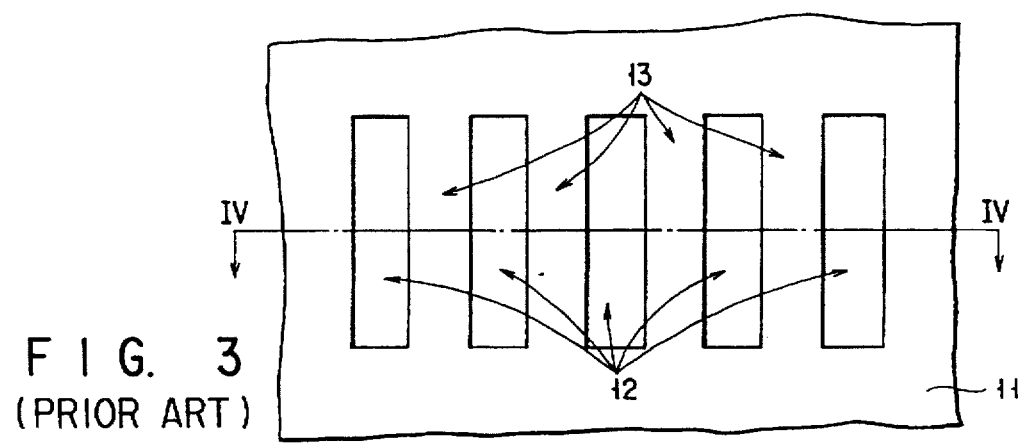
FIG. 3 is a plan view showing another conventional alignment mark.
Figure 4:
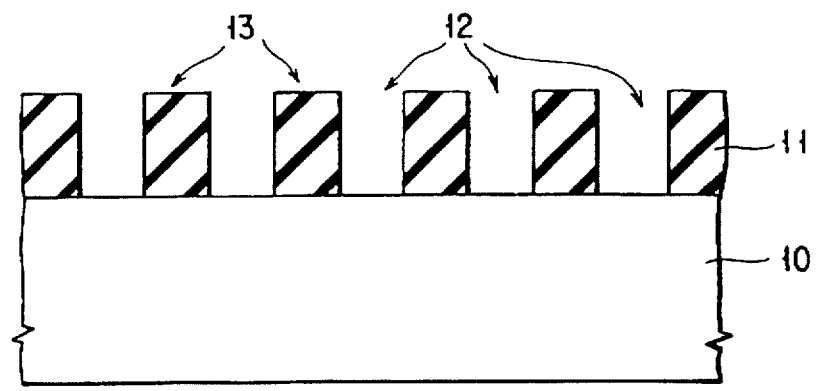
FIG. 4 is a cross-sectional view taken along the line IV-IV' in FIG. 3.
Figure 5:
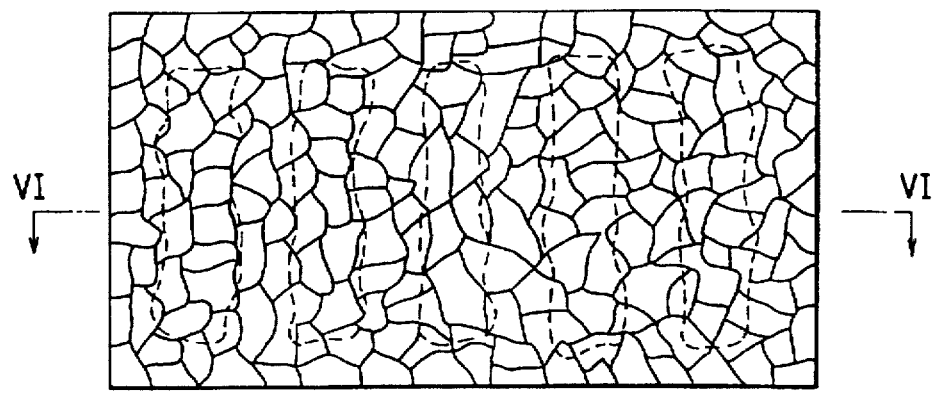
FIG. 5 is a plan view showing a metal film formed on the alignment mark shown in FIGS. 1 and 2.
Figure 6:
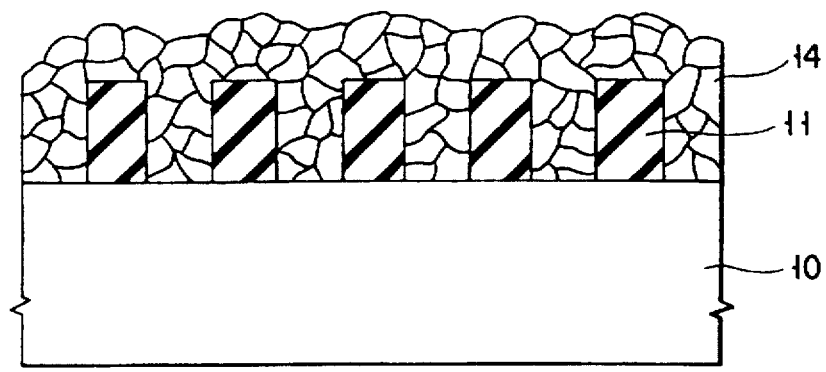
FIG. 6 is a cross-sectional view taken along the line VI-VI' in FIG. 5.
Figure 7:
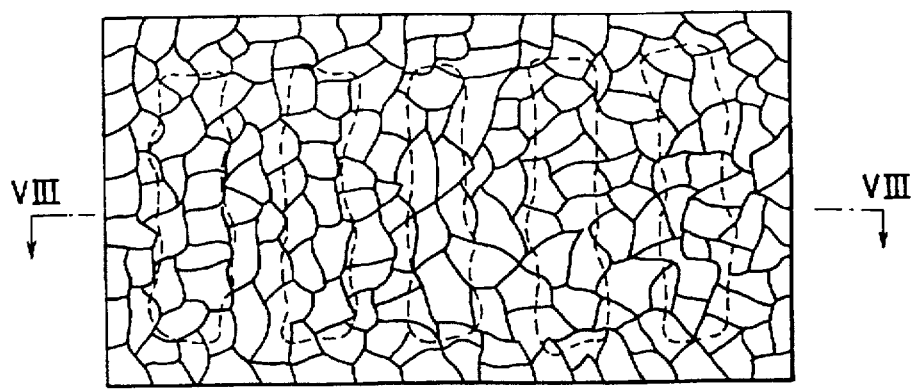
FIG. 7 is a plan view showing a metal film formed on the alignment mark shown in FIGS. 3 and 4.
Figure 8:
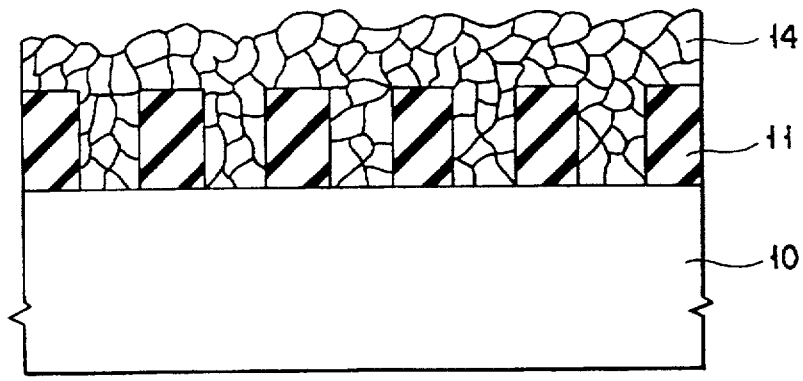
FIG. 8 is a cross-sectional view taken along the line VIII-VIII' in FIG. 7.
Figure 9:
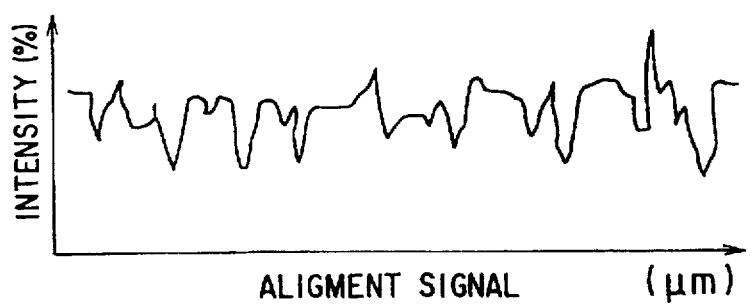
FIG. 9 is a diagram showing a signal waveform obtained from the semiconductor device shown in FIGS. 5 and 6.

The alignment mark according to this embodiment is the same as the conventional ones in that the alignment mark comprises recesses 12 and projections 13 formed on the insulating layer 11 on the semiconductor substrate 10. The alignment mark according to this embodiment however differs from the conventional ones in that the projections 13 have an annular shape as viewed from above the semiconductor substrate 10. In other words, the projection 13 is the projection 13 of the conventional alignment marks (see FIGS. 1 and 2) whose center portion is removed, leaving only the peripheral portion.

With regard to the alignment mark for the X directional alignment of, for example, a single chip area, the X directional width H of the projections 13 of this alignment mark is set smaller than the X directional width of the grain of the metal film on the alignment mark (diameter if the grain is circular) or the average size. The metal film 14 is formed by the high-temperature sputtering method or is processed by the laser melting method to be planarized.

The alignment mark has a plurality of annular projections 13 arranged in a row in the X direction. The alignment of this semiconductor device is performed by detecting the edges of the boundaries between the recesses 12 and projections 13 to thereby detect the alignment mark.

Figure 32:
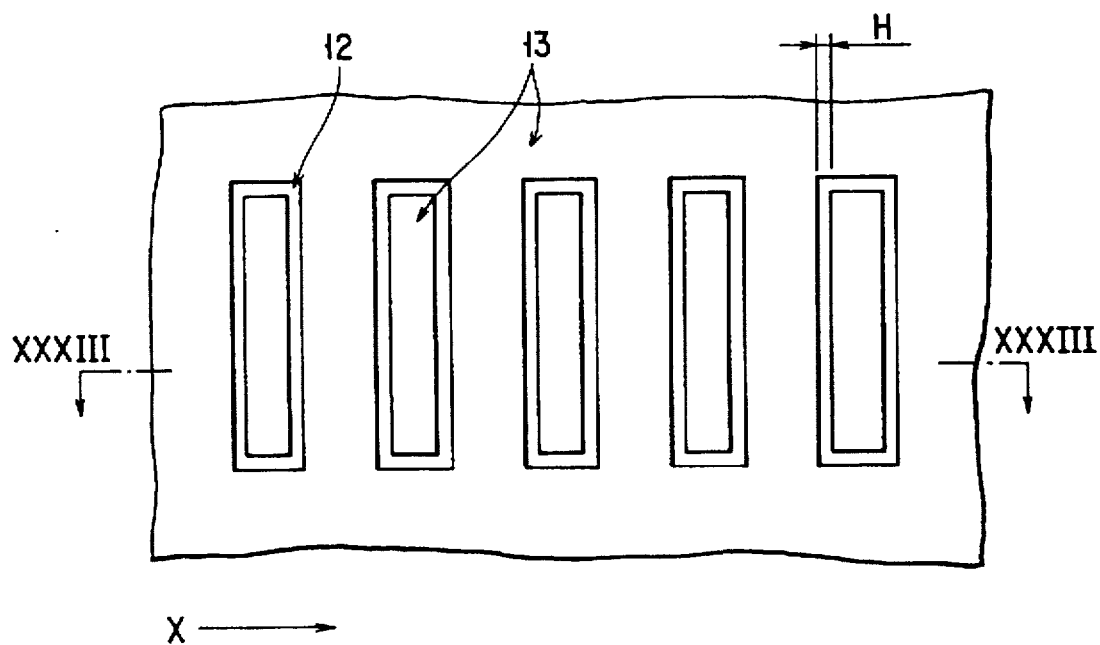
FIG. 32 is a plan view showing an alignment mark according to a tenth embodiment of the present invention.
Figure 33:
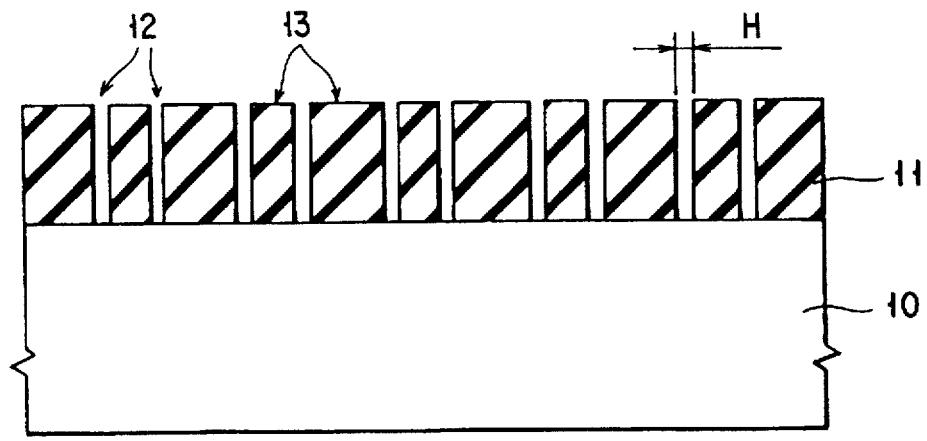
FIG. 33 is a cross-sectional view taken along the line XXXIII-XXXIII' in FIG. 32.

FIG. 32 shows a semiconductor device according to a tenth embodiment of the present invention. FIG. 33 is a cross-sectional view taken along the line XXXIII-XXXIII' in FIG. 32.

The alignment mark according to this embodiment has annular recesses 12 as viewed from above the semiconductor substrate 10. With regard to the alignment mark for the X directional alignment of, for example, a single chip area, the X directional width H of the recesses 12 of this alignment mark is set smaller than the X directional width of the grain on the metal film of the alignment mark (diameter if the grain is circular) or the average size. The metal film 14 is formed by the high-temperature sputtering method or is processed by the laser melting method to be planarized.

The alignment mark has a plurality of annular recesses 12 arranged in a row in the X direction. The alignment of this semiconductor device is performed by detecting the edges of the boundaries between the recesses 12 and projections 13 to thereby detect the alignment mark.

Figure 36:
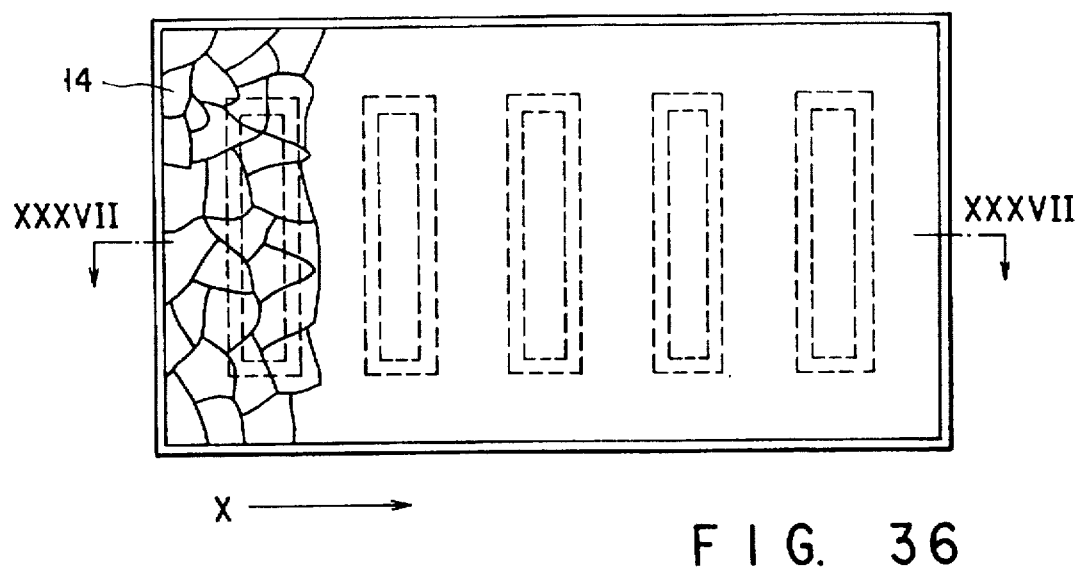
FIG. 36 is a plan view showing a metal film deposited on the alignment mark shown in FIG. 32.
Figure 37:
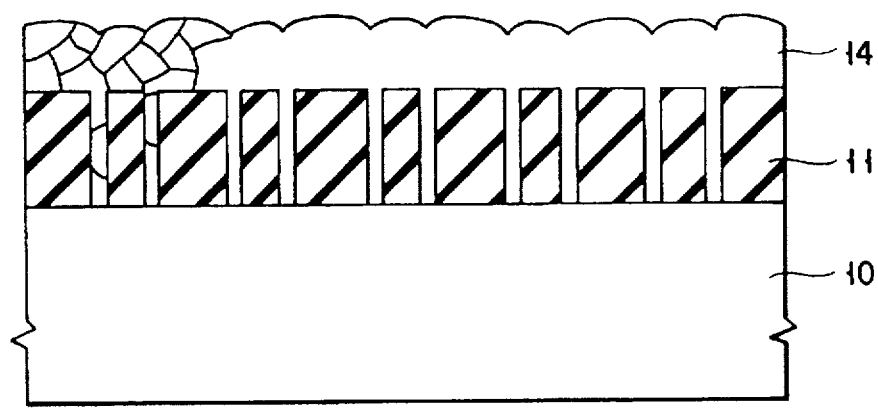
FIG. 37 is a cross-sectional view taken along the line XXXVII-XXXVII' in FIG. 36.

FIG. 34 shows a semiconductor device having a metal film (planarized) deposited on the alignment mark according to the ninth embodiment. FIG. 35 is a cross-sectional view taken along the line XXXV-XXXV' in FIG. 34. FIG. 36 shows a semiconductor device having a metal film (planarized) deposited on the alignment mark according to the tenth embodiment. FIG. 37 is a cross-sectional view taken along the line XXXVII-XXXVII' in FIG. 36.

A metal film 14 is deposited on the semiconductor substrate 10 while heating the semiconductor substrate 10° to 460° C. or above by the high-temperature sputtering method, or after deposition on the semiconductor substrate 10 by sputtering, the metal film 14 is planarized by the laser melting method.

In the use of either method, a grain is formed on the metal film 14 deposited on the semiconductor substrate 10.

According to the present invention, however, in performing the X directional alignment of, for example, a single chip area, the X directional width of the recesses or projections of the alignment mark is set smaller than the X directional width of the grain of the metal film on the alignment mark (diameter if the grain is circular) or the average size. Further, the recesses or projections are annular and are arranged in a row in the X direction.

It is therefore possible to prevent the grain on the alignment mark from making the detection of the edges (indicated by the broken lines in FIGS. 32 and 34) of the recesses and projections of the alignment mark difficult.

Figure 38:
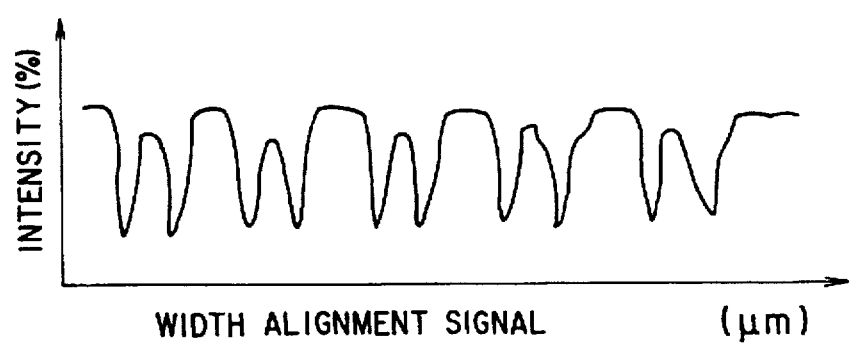
FIG. 38 is a diagram showing an alignment signal waveform of the semiconductor device in FIG. 34.

FIG. 38 shows an alignment signal waveform obtained by the stepper when the alignment of the semiconductor device in FIGS. 34 and 35 is executed through image processing.

The alignment signal waveform has not been influenced by the grain on the metal film, and the high and low intensities of the signal waveform are regularly repeated. In other words, the stepper accurately detects the edges of the recesses and projections of the alignment mark. It is therefore possible to align the semiconductor device accurately, thus eliminating the misalignment-oriented problem at the time the metal film is processed.

The alignment marks of this embodiment can be used for the alignment which involves image processing and the alignment which uses a laser beam.

FIG. 39 shows a semiconductor device according to an eleventh embodiment of the present invention. FIG. 40 is a cross-sectional view taken along the line XXXX-XXXX' in FIG. 39.

The alignment mark of this embodiment is the alignment mark of the seventh embodiment whose projections 13 are constituted by a bit pattern or a group of prismatic insulating layers 11. This alignment mark is provided for the alignment of, for example, a single chip area in the X direction.

As viewed from above the semiconductor substrate, the X directional width H of the bit pattern is set smaller than the width of a grain of the metal film formed on the alignment mark (or the diameter if the grain is circular) or the average size.

The alignment of the semiconductor device is performed by detecting the recesses and projections of the metal film on the alignment mark to thereby detect the alignment mark.

With the above structure, it possible to prevent the grain of the metal film from making the detection of the edges of the recesses and projections in the bit pattern of the metal film on the alignment mark difficult, so that the alignment mark can easily detected through image processing or the like.

Figure 41:
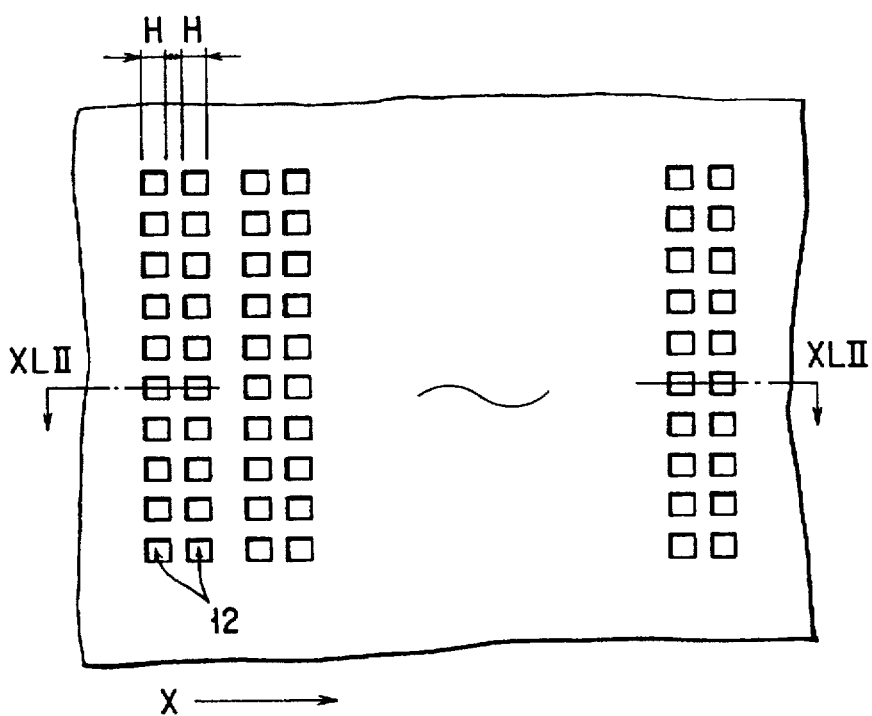
FIG. 41 is a plan view showing an alignment mark according to a twelfth embodiment of the present invention.
Figure 42:
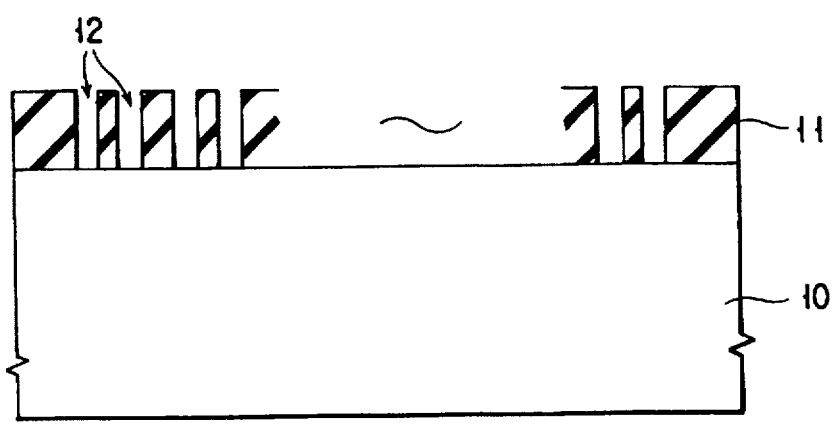
FIG. 42 is a cross-sectional view taken along the line XXXXII-XXXXII' in FIG. 41.

FIG. 41 shows a semiconductor device according to a twelfth embodiment of the present invention. FIG. 42 is a cross-sectional view taken along the line XXXX-XXXX' in FIG. 41.

The alignment mark of this embodiment is the alignment mark of the eighth embodiment whose recesses 12 are constituted by a bit pattern or a group of square-shaped holes. The bit pattern of the recesses 12 is provided on the insulating layer 12 formed on the semiconductor substrate 10. This alignment mark is provided for the alignment of, for example, a single chip area in the X direction.

As viewed from above the semiconductor substrate, the X directional width H of the bit pattern is set smaller than the width of a grain of the metal film formed on the alignment mark (or the diameter if the grain is circular) or the average size.

The alignment of the semiconductor device is performed by detecting the recesses and projections of the metal film on the alignment mark to thereby detect the alignment mark.

With the above structure, it possible to prevent the grain of the metal film from making the detection of the edges of the recesses and projections in the bit pattern of the metal film on the alignment mark difficult, so that the alignment mark can easily detected through image processing or the like.

FIG. 43 shows a metal film formed on an alignment mark.

The feature of the eleventh and twelfth embodiments lie in that in performing the X directional alignment of, for example, a single chip area, the X directional width H of the bit pattern is set smaller than the width of a grain of the metal film formed on the alignment mark (or the diameter if the grain is circular) or the average size, as viewed from above the semiconductor substrate.

It is therefore possible to easily detect the alignment mark by detecting the recesses and projections of the metal film on the alignment mark through image processing or the like.

FIG. 44 shows an alignment signal waveform obtained by the stepper when the alignment of the semiconductor device in FIG. 43 is executed through image processing. FIG. 45(a)–45(c) illustrate the principle of the alignment of the eleventh and twelfth embodiments.

According to the eleventh and twelfth embodiments, the recesses or projections are formed by a bit pattern. In executing alignment by image processing, therefore, an image recognizing area 17 contains a plurality of bit patterns. More specifically, the alignment signal waveform for that portion in the image recognizing area 17 which includes a bit pattern becomes as shown in FIG. 45(a) and the alignment signal waveform for that portion in the image recognizing area 17 which does not include a bit pattern becomes as shown in FIG. 45(b).

By approximating both signal waveforms by the bottom approximation or the like, a signal waveform as shown in FIG. 45(c) is obtained. Through such processing, the alignment signal waveform as shown in FIG. 44 as a whole is obtained.

In other words, the alignment signal waveform shown in FIG. 44 has not been influenced greatly by the grain of the metal film, and the high and low intensities of the signal waveform are regularly repeated. That is, the stepper can accurately detect the recesses and projections of the metal film on the alignment mark, thus ensuring high-precision alignment.

In the case where alignment using a laser beam is executed instead of the alignment using image processing, high-precision alignment is possible without performing approximation by scanning the bit pattern with a laser beam.

In short, according to the semiconductor device embodying the present invention, in performing the X directional alignment of, for example, a single chip area, the X directional width H of the recesses or projections of the alignment mark is set smaller than the X directional width of a grain of the metal film formed on the alignment mark (or the diameter if the grain is circular) or the average size, as viewed from above the semiconductor substrate. Further, in performing the Y directional alignment of, for example, a single chip area, the Y directional width H of the recesses or projections of the alignment mark is set smaller than the Y directional width of a grain of the metal film formed on the alignment mark (or the diameter if the grain is circular) or the average size, as viewed from above the semiconductor substrate.

Even if the recesses and projections of the metal film on the alignment mark become small due to the planarization of that metal film by the high-temperature sputtering method or laser melting method, therefore, the recesses and projections of the metal film on the alignment mark can accurately be detected by image processing or laser scanning without being affected by the grain on the metal film. That is, this invention can contribute to improving the precision of alignment in the lithography technology.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of fabricating a semiconductor device, comprising the steps of:
    predicting an average size of grains of a metal film;
    forming at least one alignment mark comprising a recess on a semiconductor wafer, said recess of said alignment mark having a width smaller than said average size of said grains of said metal film;
    forming said metal film on said alignment mark; and
    detecting said alignment mark while said metal film exists on said alignment mark.

2. The method according to claim 1, wherein said alignment mark is formed on said semiconductor wafer before formation of said metal film.

3. The method according to claim 1, wherein said alignment mark is made of a film selected from the group consisting of a silicon oxide insulating film, a silicon nitride insulating film, and a polysilicon conductive film.

4. The method according to claim 1, wherein there are a plurality of alignment marks arranged in parallel to one another.

5. The method according to claim 4, wherein an interval between adjoining alignment marks is smaller than said average size of said grains of said metal film.

6. The method according to claim 1, wherein there are a plurality of alignment marks arranged in a matrix form.

7. The method according to claim 1, wherein said average size of said grains of said metal film is determined by $$2\times(S/n\pi)^{1/2}$$

where S is a unit area at an arbitrary position on said semiconductor substrate and n is a number of grains of a metal film included in said unit area S.

8. The method according to claim 1, wherein said average size of said grains of said metal film is determined by $$(a\times b)^{1/2}$$

where a is a longer radius of an ellipse which is a substantial shape of a metal film as viewed from above said semiconductor substrate and b is a shorter radius of said ellipse.

9. The method according to claim 7 or 8, wherein said average size of said grains is an average value of values obtained at a plurality of positions on said semiconductor wafer.

10. The method according to claim 1, wherein said metal film is made of aluminum and said alignment mark has a width of 1 µm or narrower.

11. The method according to claim 1, wherein said metal film is made of copper and said alignment mark has a width of 4 µm or narrower.

12. The method according to claim 1, wherein said metal film is made of aluminum and said alignment mark has a width ranging from 1 µm to the average size of grains of said metal film.

13. The method according to claim 1, wherein said metal film is made of copper and said alignment mark has a width ranging from 4 µm to the average size of grains of said metal film.

14. A method of aligning a semiconductor wafer, comprising the steps of:
    predicting an average size of grains of a metal film;
    forming at least one alignment mark comprising a recess, formed on said semiconductor wafer, said recess of said alignment mark having a width smaller than said average size of said grains of said metal film;
    forming said metal film on said alignment mark; and
    detecting said alignment mark to execute alignment for processing said semiconductor wafer.

15. The method according to claim 14, wherein said alignment is executed by setting an area containing at least said metal film on said alignment mark as an image recognizing area, irradiating light to said image recognizing area and detecting reflected light therefrom.

16. The method according to claim 14, wherein said alignment is executed by irradiating a laser beam on at least said metal film on said alignment mark and detecting diffracted light or scattered light of said laser beam.

17. A method of fabricating a semiconductor device, comprising the steps of:
    predicting an average size of grains of a metal film;
    forming at least one alignment mark on a semiconductor wafer, said alignment mark comprising a projection having a width smaller than said average size of said grains of said metal film; and
    forming said metal film on said alignment mark.

18. The method according to claim 17, wherein said alignment mark is formed on said semiconductor wafer before formation of said metal film.

19. The method according to claim 17, wherein said alignment mark is made of a film selected from the group consisting of a silicon oxide insulating film, a silicon nitride insulating film, and a polysilicon conductive film.

20. The method according to claim 17, wherein a plurality of alignment marks are formed on the semiconductor wafer and arranged in parallel to one another.

21. The method according to claim 20, wherein the alignment marks are spaced by an interval smaller than said average size of said grains of said metal film.

22. The method according to claim 17, wherein a plurality of alignment marks are formed on the semiconductor wafer and arranged in a matrix form.

23. The method according to claim 17, wherein said average size of said grains of said metal film is determined by $2 \times (S/n\pi)^{1/2}$, where S is a unit area at an arbitrary position on said semiconductor substrate and n is a number of grains of a metal film included in said unit area S.

24. The method according to claim 17, wherein said average size of said grains of metal film is determined by $(a \times b)^{1/2}$, wherein the metal film is shaped substantially as an ellipse as viewed from above said semiconductor substrate and where a is a longer radius of the ellipse and b is a shorter radius of the ellipse.

25. The method according to claim 23, wherein said average size of said grains is an average value of values obtained at a plurality of positions on said semiconductor wafer.

26. The method according to claim 24, wherein said average size of said grains is an average value of values obtained at a plurality of positions on said semiconductor wafer.

27. The method according to claim 17, wherein said metal film is made of aluminum and said alignment mark has a width of 1 μm or narrower.

28. The method according to claim 17, wherein said metal film is made of copper and said alignment mark has a width of 4 μm or narrower.

29. The method according to claim 17, wherein said metal film is made of aluminum and said alignment mark has a width ranging from 1 μm to the average size of said grains of metal film.

30. The method according to claim 17, wherein said metal film is made of copper and said alignment mark has a width ranging from 4 μm to the average size of said grains of metal film.

31. A method of aligning a semiconductor wafer, comprising the steps of:

predicting an average size of grains of a metal film;

forming at least one alignment mark on said semiconductor wafer, said alignment mark comprising a projection having a width smaller than said average size of said grains of said metal film;

forming said metal film on said alignment mark; and detecting said alignment mark to execute alignment for processing said semiconductor wafer.

32. The method according to claim 31, wherein said alignment is executed by setting an area containing at least said metal film on said alignment mark as an image recognizing area, irradiating light to said image recognizing area, and detecting light reflected therefrom.

33. The method according to claim 31, wherein said alignment is executed by irradiating a laser beam on at least said metal film on said alignment mark and detecting diffracted light or scattered light of said laser beam.

* * * * *